United States Patent
Shishido et al.

(10) Patent No.: US 6,229,196 B1
(45) Date of Patent: *May 8, 2001

(54) SEMICONDUCTOR DEVICE AND FABRICATION METHOD THEREOF

(75) Inventors: Nobuyasu Shishido; Mitsuyoshi Takeda; Yoshifumi Tomomatsu, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,143

(22) Filed: Jan. 6, 1998

(30) Foreign Application Priority Data

Jul. 30, 1997 (JP) .................................. 09-204278

(51) Int. Cl.[7] ........................... H01L 29/04; H01L 29/78; H01L 31/0368
(52) U.S. Cl. ........................ 257/617; 257/155; 257/139; 257/341; 257/913; 257/172
(58) Field of Search .................... 257/172, 139, 257/155, 342, 341, 617, 913

(56) References Cited

U.S. PATENT DOCUMENTS 5,698,891 * 12/1997 Tomita ................... 257/913
5,731,637 * 3/1998 Hori ...................... 257/913
5,883,403 * 3/1999 Ishikawa ................ 257/913

FOREIGN PATENT DOCUMENTS

| 58-138035 | 8/1983 | (JP) . |
| 64-46937 | 2/1989 | (JP) . |
| 4-14836 | 1/1992 | (JP) . |
| 5-82526 | 4/1993 | (JP) . |
| 7-38102 | 2/1995 | (JP) . |

* cited by examiner

Primary Examiner—Jerome Jackson, Jr.
(74) Attorney, Agent, or Firm—Oblon, Spivak, McClelland, Maier & Neustadt, P.C.

(57) ABSTRACT

The semiconductor device includes a semiconductor base body (11) formed of a damaged layer (102) serving as a gettering layer, a $P^+$ collector layer (103), an $N^+$ buffer layer (104), and an $N^-$ layer (105) laid one on top of another, a gate electrode (27) selectively formed on the upper main surface of the semiconductor base body (11) specifically on the external main surface of the $N^-$ layer (105), with a gate insulating film (26) interposed therebetween, an emitter electrode (28) selectively formed on the upper main surface of the semiconductor base body (11), and a collector electrode (106) formed on the lower main surface of the semiconductor base body (11), specifically on the external main surface of the damaged layer (102).

14 Claims, 22 Drawing Sheets

SEMICONDUCTOR DEVICE AND FABRICATION METHOD THEREOF

BACKGROUND OF THE INVENTION

1. Field of the Invention

The present invention relates to semiconductor devices and methods for manufacturing the same, and particularly to a semiconductor device having a vertical structure with reduced ON-state voltage and improved fabrication yield and a method for manufacturing the same.

2. Description of the Background Art

FIG. 43 shows the structure of an insulated-gate bipolar transistor (hereinafter, referred to as an IGBT) 90 as an example of a vertical-type semiconductor device in which the main current flows vertically with respect to the main surface of the substrate.

As shown in FIG. 43, the IGBT 90 has a semiconductor base body 1 composed of a $P^+$ collector layer 20, an $N^+$ buffer layer 21, an $N^-$ layer 22 laid one on top of another, a gate electrode 27 selectively formed on the upper main surface of the semiconductor base body 1, specifically on the external main surface of the $N^-$ layer 22 with a gate insulating film 26 interposed therebetween, an emitter electrode 28 selectively formed on the upper main surface of the semiconductor base body 1, and a collector electrode 29 formed on the lower main surface of the semiconductor base body 1, specifically on the external main surface of the $P^+$ collector layer 20.

A P base region 23 is selectively formed in the part extending from the surface of the $N^-$ layer 22 to the inside thereof, and a pair of $N^+$ emitter regions 24 are selectively formed to face each other at a certain interval in the part extending from the surface of the P base region 23 to the inside thereof. Formed on the facing ends of the pair of $N^+$ emitter regions 24 and on the P base region 23 therebetween is the emitter electrode 28. The gate electrode 27 is located over the other ends of the pair of $N^+$ emitter regions 24, the part of the P base region 23 adjacent to those ends, and the part of the $N^-$ layer 22 adjacent to the P base region 23, with the gate insulating film 26 interposed therebetween. When the device operates, the part inside the surface of the P base region 23 interposed between the $N^-$ layer 22 and the $N^+$ emitter regions 24 under the gate electrode 27 serves as a channel region 25. The P base region 23, the $N^+$ emitter regions 24, the gate insulating film 26, the gate electrode 27, and the emitter electrode 28 formed on the upper main surface side of the semiconductor base body 1 form an MOSFET, which part is called an MOS region 10.

Next, operation of the IGBT 90 will be described. An application of a positive voltage to the gate electrode 27 causes the surface of the P base region 23 right under the gate electrode 27 to invert into N type to form the channel region 25, so that the electrons are injected from the $N^+$ emitter regions 24 through the channel region 25 into the $N^-$ layer 22. At the same time, a very large number of holes (minority carriers) are injected from the $P^+$ collector layer 20 into the $N^-$ layer 22, so that the $N^-$ layer 22 causes conductivity modulation, which provides the advantage that the electric resistance of the $N^-$ layer 22 becomes relatively low.

In the operation of the IGBT 90 described above, the electric resistance of the $N^-$ layer 22 causing the conductivity modulation can be expressed by the expression (1) below:

$$R \propto \frac{W^2}{2\sqrt{D \cdot \tau^2}}$$

In this expression (1), R represents the electric resistance of the $N^-$ layer 22, W represents the thickness of the $N^-$ layer 22, D represents the diffusion coefficient of carriers, and $\tau$ represents the life time of the carriers in the $N^-$ layer 22. Accordingly, the expression (1) shows that the electric resistance of the $N^-$ layer 22 is proportional to the thickness of the $N^-$ layer 22 and largely depends on the life time of the carriers in the $N^-$ layer 22.

Increasing the breakdown voltage of the IGBT 90 requires increasing the thickness of the $N^-$ layer 22, which raises the problem of high electric resistance. Suppressing the increase in electric resistance as low as possible requires lengthening the life time of the carriers. However, the life time of the carriers largely depends on the quantity of metal impurities, especially heavy metal impurities, included in the semiconductor layer.

An unprocessed, new semiconductor substrate (wafer) contains almost no heavy metal impurities. However, the semiconductor layers are inevitably contaminated with heavy metal impurities in various process steps for fabricating semiconductor devices.

The contamination by heavy metal impurities will now be described for the process of fabricating the IGBT 90 as an example. For example, to obtain a breakdown voltage equal to or higher than 2000 V with the IGBT 90, the $N^-$ layer 22 must have a thickness of 150 μm or larger. With an IGBT of an intermediate breakdown voltage (e.g., a breakdown voltage of about 1200 V) or lower, an N+buffer layer and an $N^-$ layer are formed on a $P^+$ substrate generally by epitaxial growth. However, this method can be used because the $N^-$ layer has a small thickness, and forming an $N^-$ layer 22 of 150 μm or thicker by epitaxial growth is technically very difficult and very expensive at present.

Accordingly, when manufacturing the IGBT 90, a single-crystal $N^-$ silicon substrate is prepared as a semiconductor substrate and N-type impurities are introduced from the back side of the $N^-$ silicon substrate (the side on which the collector electrode is formed) by an ion implantation, and a thermal diffusion is applied to obtain a desired diffusion depth to form the $N^+$ buffer layer 21. Next, P-type impurities are introduced from the back side of the $N^-$ silicon substrate by an ion implantation, followed by a thermal diffusion to a desired diffusion depth to form the $P^+$ collector layer 20.

Since a thermal treatment is conducted when forming the $N^+$ buffer layer 21 at 1200° C. for 20 hours, for example, the possibility of contamination with heavy metal impurities is stronger than the case of IGBTs with intermediate or lower breakdown voltages which do not require this kind of process step.

Obtaining semiconductor devices with long carrier life time requires prevention of the contamination by heavy metal impurities, which requires heavy equipment investment to improve the fabrication systems and the like.

Generally, however, in order to prevent the contamination by heavy metal impurities to prevent reduction in life time of carriers without requiring such equipment investment, gettering process for excluding the injurious heavy metal impurities from the semiconductor layers is adopted in the process of fabricating semiconductor devices.

Heavy metal impurities such as iron (Fe) and copper (Cu) have a property of depositing at crystal defects in silicon, and a property of presenting very large diffusion coefficients at high temperatures. The gettering utilizes these properties. Known gettering methods include the intrinsic gettering in which a crystal defect layer forming a gettering core is formed in the silicon substrate in such a part as not to affect the electric characteristics and the extrinsic gettering in which a mechanically damaged layer is formed as a gettering layer by forming crystal defects on the back side of the wafer by sandblasting or the like, or in which a polysilicon layer containing many crystal defects is formed.

In the conventional extrinsic gettering method, the gettering layer is finally removed in most cases.

For example, Japanese Patent Laying-Open Gazette No.58-138035 shows a structure in which a polysilicon layer for gettering is formed on the back side of a semiconductor substrate, which suggests removing the polysilicon layer when an electrode is formed on the back side. Further, Japanese Patent Laying-Open Gazette No.7-38102 shows a structure in which a polysilicon layer or a sandblasted layer for gettering is formed on a surface of a collector layer of an IGBT, but any of them are removed before formation of a collector electrode.

As has been stated so far, the vertical-type semiconductor devices having high breakdown voltages have the problem that they are susceptible to contamination with heavy metal impurities.

SUMMARY OF THE INVENTION

According to a first aspect of the present invention, a semiconductor device comprises: a first semiconductor layer of a first conductivity type; a second semiconductor layer of a second conductivity type at a relatively high concentration provided to form an interface with a first main surface of the first semiconductor layer; a gettering layer provided to form an interface with a first main surface of the second semiconductor layer on the opposite side to the interface with the first semiconductor layer, for segregating metal impurities; a first main electrode provided to be in contact with at least a first main surface of the gettering layer on the opposite side to the interface with the second semiconductor layer; and a second main electrode provided on a second main surface of the first semiconductor layer on the opposite side to the first main surface of the first semiconductor layer.

Preferably, according to a second aspect, in the semiconductor device, the first semiconductor layer has, in its inside, a third semiconductor layer of the first conductivity type at a relatively high concentration provided to form an interface with the second semiconductor layer.

Preferably, according to a third aspect, in the semiconductor device, the gettering layer is a damaged layer having crystal defects caused by mechanical damage.

Preferably, according to a fourth aspect, in the semiconductor device, the gettering layer is a polysilicon layer having crystal defects.

Preferably, according to a fifth aspect, in the semiconductor device, the polysilicon layer is selectively formed on the first main surface of the second semiconductor layer, and the first main electrode is formed to be in contact also with the second semiconductor layer.

Preferably, according to a sixth aspect, in the semiconductor device, the gettering layer is shaped in the form of a plurality of stripes arranged at intervals in a plane view.

Preferably, according to a seventh aspect, in the semiconductor device, the gettering layer is shaped in the form of a plurality of island-like regions arranged at intervals in a plane view.

According to an eighth aspect of the present invention, a method for fabricating a semiconductor device comprises the steps of: (a) forming a gettering layer for segregating metal impurities on a first main surface of a semiconductor substrate of a first conductivity type; (b) introducing impurities of a second conductivity type through the gettering layer into the semiconductor substrate and diffusing the impurities by a thermal diffusion to a first depth at a relatively high concentration, so as to make a region where the impurities of the second conductivity type do not reach a first semiconductor layer of the first conductivity type and to make a region where the impurities of the second conductivity type diffuse a second semiconductor layer forming an interface with the gettering layer; (c) forming a first main electrode to be in contact with at least a first main surface of the gettering layer on the opposite side to the interface with the second semiconductor layer; and (d) forming a second main electrode to be in contact with a second main surface of the semiconductor substrate on the opposite side to the first main surface.

Preferably, according to a ninth aspect, the semiconductor device fabricating method further includes, prior to the step (b), the step of introducing impurities of the first conductivity type through the gettering layer into the semiconductor substrate and diffusing the impurities by a thermal diffusion to a second depth deeper than the first depth to form a third semiconductor layer at a relatively high concentration.

Preferably, according to a tenth aspect, in the semiconductor device fabricating method, the step (a) comprises the step of sandblasting the first main surface of the semiconductor substrate to apply mechanical damage to cause crystal defects.

Preferably, according to an eleventh aspect, in the semiconductor device fabricating method, the step (a) comprises the step of forming a polysilicon layer by CVD on one main surface of the semiconductor substrate.

Preferably, according to a twelfth aspect, in the semiconductor device fabricating method, the step of forming the polysilicon layer comprises the step of forming the polysilicon layer all over the first main surface of the semiconductor substrate and then applying patterning by photolithography to selectively remove the polysilicon layer.

According to a thirteenth aspect of the present invention, a semiconductor device comprises a semiconductor base body formed on the basis of a semiconductor substrate of a first conductivity type and having a plurality of semiconductor layers, a first main electrode formed on a first main surface of the semiconductor base body, and a second main electrode provided on a second main surface of the semiconductor base body on the opposite side to the first main surface, wherein a main current flows between the first and second main electrodes, and wherein the first main surface of the semiconductor base body is a main surface of a gettering layer for segregating metal impurities, the semiconductor base body has a first semiconductor layer of a second conductivity type at a relatively high concentration provided to form an interface with the gettering layer, and the first main electrode is formed on at least the gettering layer.

Preferably, according to a fourteenth aspect, in the semiconductor device, the semiconductor base body comprises a second semiconductor layer of the first conductivity type at a relatively high concentration provided to form an interface with a main surface of the first semiconductor layer on the opposite side to the interface with the gettering layer.

According to the semiconductor device of the first aspect of the present invention, the presence of the gettering layer causes metal impurities which are inevitably introduced when forming the second semiconductor layer of the second conductivity type, for example, to segregate in the gettering layer. This prevents the metal impurities from increasing in the fabrication process, which increases the carrier life time in the first semiconductor layer. Then the electric resistance is reduced to enable reduction in ON-state voltage. Since the first main electrode is formed at least on the gettering layer, forming the gettering layer with an irregular surface increases the contact area with the first main electrode, which reduces the contact resistance to reduce the ON-state voltage. This cooperates with the effect of reducing the ON-state voltage by gettering of metal impurities to further reduce the ON-state voltage of the semiconductor device.

According to the semiconductor device of the second aspect of the present invention, the depletion layer extending from the second main electrode side when the semiconductor device is turned off is prevented from reaching the second semiconductor layer, which prevents punch-through. With this structure, as well, metal impurities inevitably introduced when the third semiconductor layer is formed are made to segregate in the gettering layer, which prevents the metal impurities from increasing in the fabrication process. This increases the carrier life time in the first semiconductor layer, and thus the electric resistance is reduced to reduce the ON-state voltage.

According to the semiconductor device of the third aspect of the present invention, since the gettering layer is formed of a damage layer, it is possible to easily adjust the size and number of the crystal defects by devising the method for applying the mechanical damage. It is also possible to arbitrarily adjust the degree of roughness on the surface. This allows an increase in contact area with the first main electrode to allow a reduction in the electric resistance, and which allows a reduction in the ON-state voltage.

According to the semiconductor device of the fourth aspect of the present invention, the gettering layer is formed of a polysilicon layer. Irregularities on the surface of the polysilicon layer increase the contact area with the first main electrode to reduce the electric resistance. Since it is relatively easy to control the thickness of the polysilicon layer, variations in ON-state voltage due to differences in thickness among polysilicon layers can be prevented.

According to the semiconductor device of the fifth aspect of the present invention, the polysilicon layer is selectively formed. As compared with the case where the polysilicon layer is formed on the entire surface, stresses due to oxide film formed on the polysilicon layer are reduced, which prevents the semiconductor substrate from bowing.

According to the semiconductor device of the sixth aspect of the present invention, the peripheral edge portion of the semiconductor substrate is certainly prevented from bowing in the direction perpendicular to the direction of arrangement of the plurality of stripes.

According to the semiconductor device of the seventh aspect of the present invention, the edge of the semiconductor substrate is prevented from bowing in any part.

According to the semiconductor device fabrication method of the eighth aspect of the present invention, a fabrication method suitable for the semiconductor device of the first aspect is obtained. Since the second semiconductor layer is formed after formation of the gettering layer, heating in the thermal diffusion process causes metal impurities which are inevitably introduced into the semiconductor base body when forming the second semiconductor layer to segregate in the gettering layer.

According to the semiconductor device fabrication method of the ninth aspect of the present invention, a fabrication method suitable for the semiconductor device of the second aspect is obtained. Since the third semiconductor layer is formed after formation of the gettering layer, heating in the thermal diffusion process causes metal impurities which are inevitably introduced into the semiconductor base body when forming the third semiconductor layer to segregate in the gettering layer.

According to the semiconductor device fabrication method of the tenth aspect of the present invention, the gettering layer can be formed relatively easily. Size and number of the crystal defects can be easily adjusted by adjusting the grain size of the abrasive for sandblasting, and the degree of surface roughness can also be arbitrarily adjusted.

According to the semiconductor device fabrication method of the eleventh aspect of the present invention, it is possible to prevent variations in thickness of the polysilicon layers among semiconductor devices because it is relatively easy to control the thickness of the polysilicon layers, which prevents variations in ON-state voltage due to the differences in thickness.

According to the semiconductor device fabrication method of the twelfth aspect of the present invention, it is easy to form the polysilicon layer selectively. As compared with the case in which the polysilicon layer is formed on the entire surface, stresses due to oxide film formed on the polysilicon layer are reduced, which prevents the semiconductor substrate from bowing.

According to the semiconductor device of the thirteenth aspect of the present invention, the presence of the gettering layer on one main surface of the semiconductor base body causes metal impurities inevitably introduced into the semiconductor base body when forming the first semiconductor layer of the second conductivity type in the semiconductor substrate of the first conductivity type, for example, to segregate in the gettering layer. This prevents the metal impurities from increasing in the semiconductor base body, which increases the carrier life time in the first conductivity type semiconductor substrate portion to reduce the electric resistance, and to enable a reduction in ON-state voltage. Since the first main electrode is formed on at least the gettering layer, forming the gettering layer with an irregular surface increases the contact area with the first main electrode, which reduces the contact resistance to reduce the ON-state voltage. This cooperates with the effect of reducing the ON-state voltage by gettering of metal impurities to further reduce the ON-state voltage of the semiconductor device.

According to the semiconductor device of the fourteenth aspect of the present invention, the depletion layer extending from the second main electrode side when turning off the semiconductor device is prevented from reaching the first semiconductor layer, which prevents punch-through. With this structure, as well, metal impurities inevitably introduced into the semiconductor base body when the second semiconductor layer of the first conductivity type is formed in the semiconductor substrate of the first conductivity type are made to segregate in the gettering layer, which prevents an increase of metal impurities in the semiconductor base body. This lengthens the carrier life time in the first conductivity type semiconductor substrate portion, thus reducing the electric resistance and reducing the ON-state voltage.

The present invention has been made to solve the problem stated before. An object of the invention is to provide a vertical-type semiconductor device having high breakdown voltage which prevents reduction in life time of carriers due to contamination by heavy metal impurities and which effectively utilizes the gettering layer by paying attention to the characteristics of the gettering layer, which have not been conventionally considered, and a manufacturing method thereof.

These and other objects, features, aspects and advantages the present invention will become more apparent from the following detailed description of the present invention when taken in conjunction with the accompanying drawings.

DESCRIPTION OF THE PREFERRED EMBODIMENTS

<First Preferred Embodiment>
<1-1. Device Structure>

Figure 1:
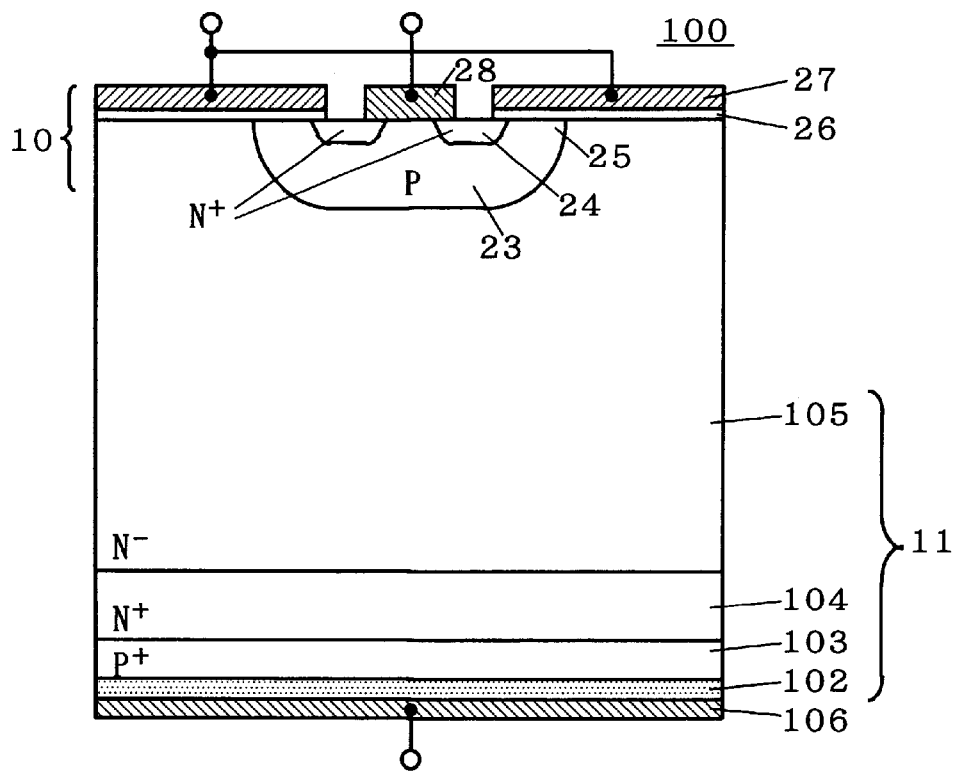
FIG. 1 is a cross-sectional view showing the structure of a semiconductor device according to a first preferred embodiment of the present invention.
Figure 2:
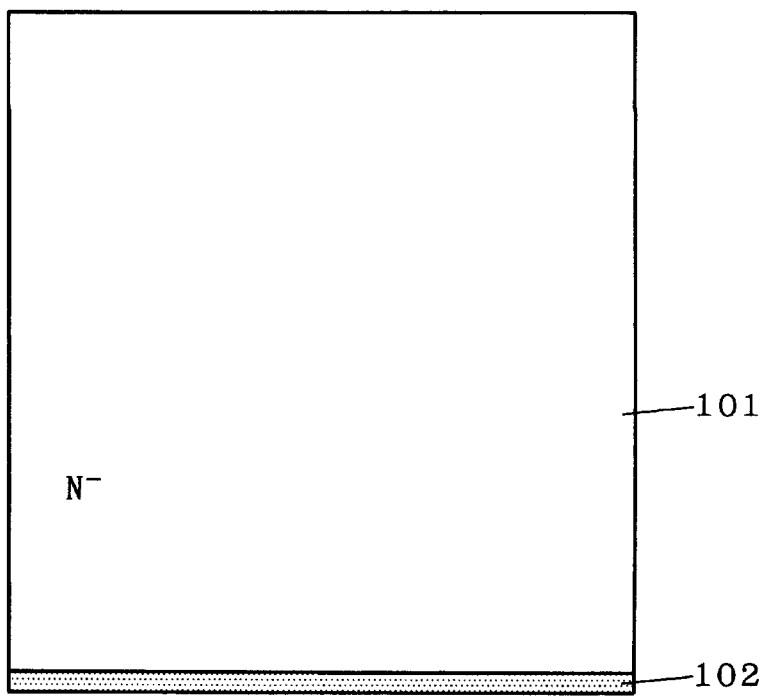
FIGS. 2 to 8 are cross-sectional views showing the process of manufacturing the semiconductor device of the first preferred embodiment of the invention.

FIG. 1 shows a cross-sectional structure of an insulated-gate bipolar transistor (hereinafter referred to simply as an IGBT) 100 as a first preferred embodiment of the present invention.

As shown in FIG. 1, the IGBT 100 includes a semiconductor base body 11 formed of a damaged layer 102 serving as a gettering layer, a $P^+$ collector layer 103 (a second semiconductor layer), an $N^+$ buffer layer 104 (a third semiconductor layer), and an $N^-$ layer 105 (a first semiconductor layer) laid one on top of another, a gate electrode 27 selectively formed on the upper main surface of the semiconductor base body 11, specifically on the external main surface of the $N^-$ layer 105, with a gate insulating film 26 interposed therebetween, an emitter electrode 28 (a second main electrode) selectively formed on the upper main surface of the semiconductor base body 11, and a collector electrode 106 (a first main electrode) formed on the lower main surface of the semiconductor base body 11, specifically on the external main surface of the damaged layer 102.

Since the semiconductor base body is formed by introducing and diffusing impurities into a single-crystal silicon substrate containing N-type impurities at a relatively low concentration, it can be said that it is formed on the basis of a semiconductor substrate. The same is true for the second to fifth preferred embodiments described later.

A P base region 23 is selectively formed in the part extending from the surface of the $N^-$ layer 105 to the inside thereof, and a pair of $N^+$ emitter regions 24 are selectively formed to face each other at a certain interval in the part extending from the surface of the P base region 23 to the inside thereof. The emitter electrode 28 is formed on the opposing ends of the pair of $N^+$ emitter regions 24 and on the P base region 23 between the opposing ends of the pair of $N^+$ emitter regions 24. The gate electrode 27 is formed on the other ends of the pair of $N^+$ emitter regions 24, the P base region 23 adjacent to those ends, and the $N^-$ layer 105 adjacent to the P base region 23, with the gate insulating film 26 interposed therebetween. When the device operates, the inside of surface of the P base region 23 interposed between the $N^-$ layer 105 and the $N^+$ emitter regions 24 under the gate electrode 27 serves as a channel region 25. The P base region 23, the $N^+$ emitter regions 24, the gate insulating film 26, the gate electrode 27, and the emitter electrode 28 formed on the upper main surface side of the semiconductor base body 11 form an MOSFET, which part is called an MOS region 10.

<1-2. Fabrication Method>

Next, a method for fabricating the IGBT 100 will be described referring to FIGS. 2 to 8. First, in the process step shown in FIG. 2, a single-crystal silicon substrate 101 containing N-type impurities at a relatively low concentration is prepared and its lower main surface (the side on which the collector electrode is formed later) is sandblasted to form the damaged layer 102 having mechanically formed crystal defects. In the sandblasting process, an abrasive with a grain size of No.1200 in JIS standard is used, for example.

Figure 3:
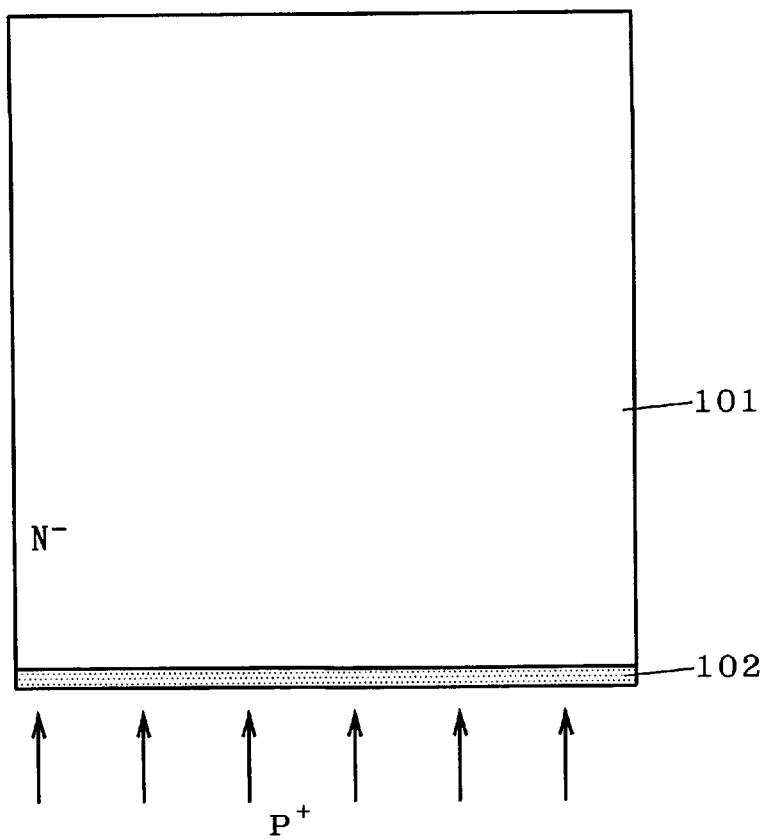

Next, in the process step shown in FIG. 3, phosphorus ions are implanted from the lower main surface side of the silicon substrate 101 by an ion implantation to a dose of about $1\times10^{14}/cm^2$, for example.

Figure 4:
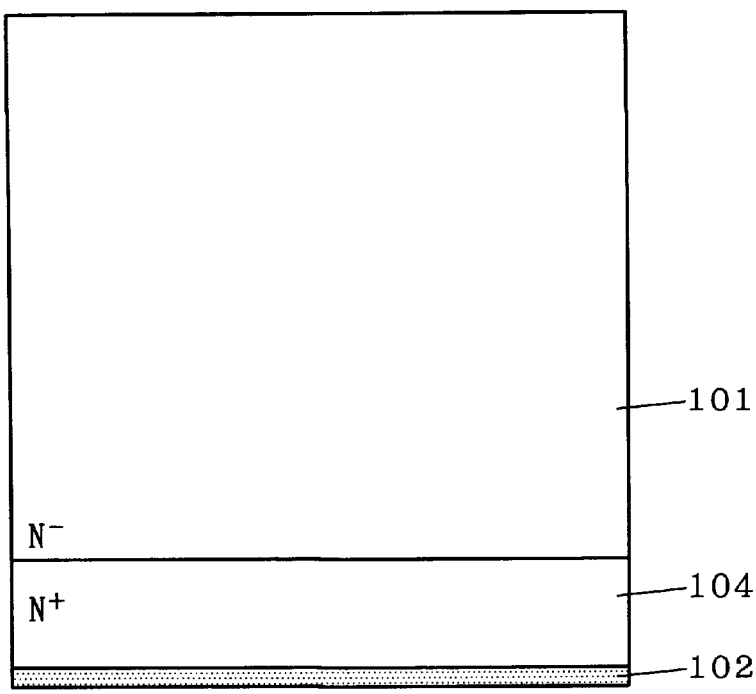

Next, in the process step shown in FIG. 4, the implanted phosphorus ions are diffused by a thermal diffusion to form the N⁺ buffer layer 104. The diffusion depth of the N⁺ buffer layer 104 is about 20 μm, for example. The diffusion conditions include 1200° C., about 20 hours, plus the total of those in a thermal treatment for forming the P⁺ collector layer and thermal treatments used to form the MOS region 10 described later.

Figure 5:
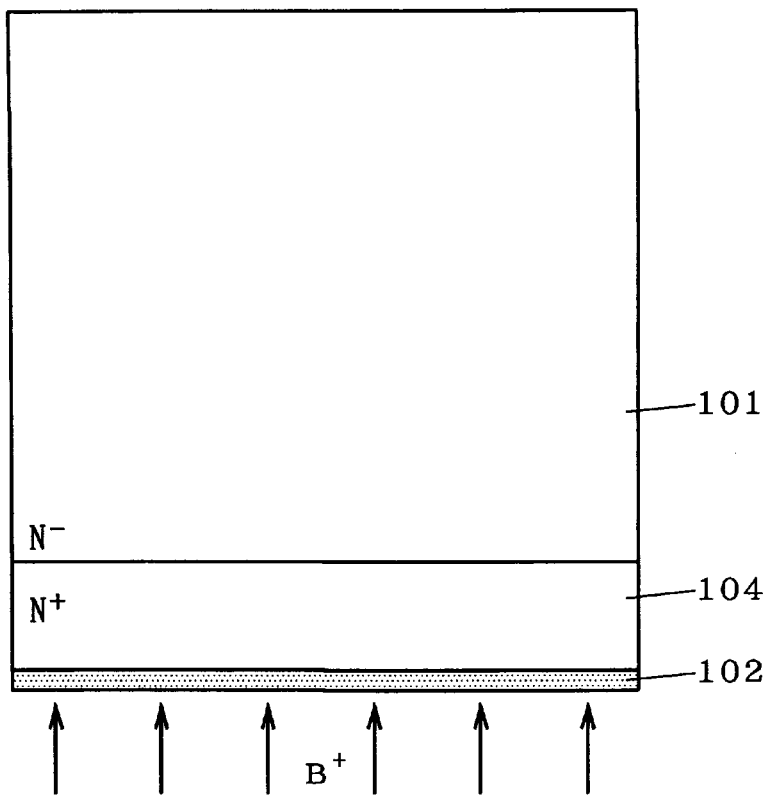

Next, in the process step shown in FIG. 5, boron ions are implanted from the lower main surface side of the silicon substrate 101 by an ion implantation to a dose of about $1 \times 10^5/cm^2$, for example.

Figure 6:
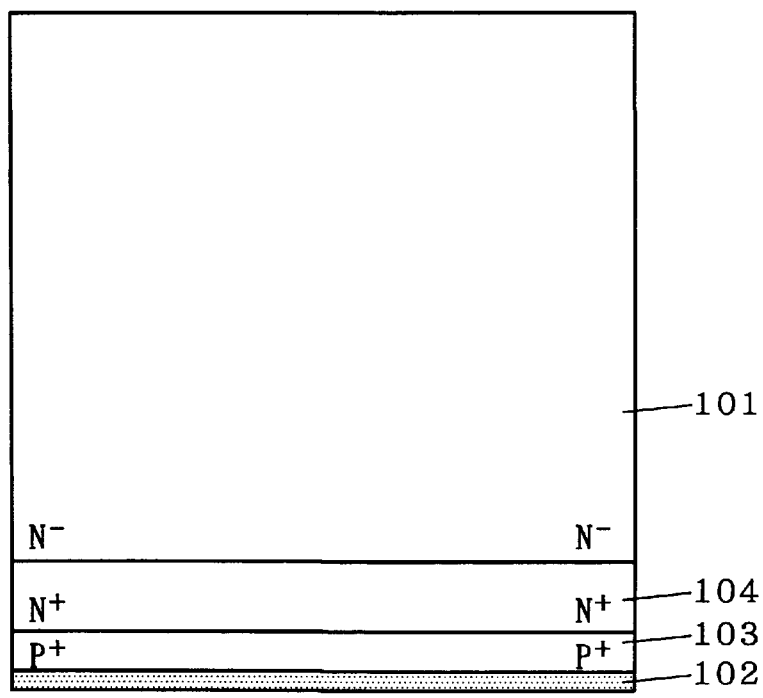

Next, in the process step shown in FIG. 6, the implanted boron ions are diffused by a thermal diffusion to form the P⁺ collector layer 103. The diffusion depth of the P⁺ collector layer 103 is 10 um or smaller, and preferably is about 1 to 6 μm. The diffusion conditions include a temperature of 1100° C., one hour, plus the total of those in the thermal treatments used to form the MOS region 10.

Thus forming a thin P⁺ collector layer 103 reduces the time required for the thermal diffusion, which reduces the heavy metal contamination caused by the thermal diffusion, and which also improves the trade-off relation between the switching time and the ON-state voltage.

Figure 7:
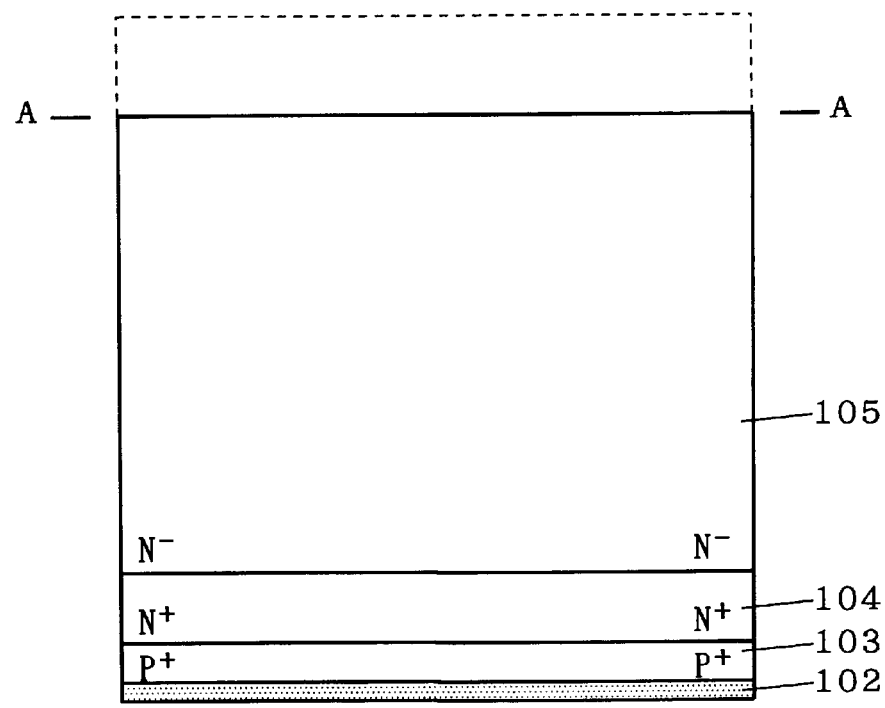

Next, in the process step shown in FIG. 7, the upper main surface of the silicon substrate 101 (the side on which the emitter electrode is formed later) is removed to a certain thickness as shown by the line A—A to remove oxide film attached in the preceding process steps and N and P layers formed by roundabout penetration of ions in formation of the diffusion layers. The remaining part of the silicon substrate 101 serves as the N⁻ layer 105. Obtaining a breakdown voltage of about 2000 V with the IGBT 100 requires that the N⁻ layer 105 has a thickness of 150 μm or larger.

Figure 8:
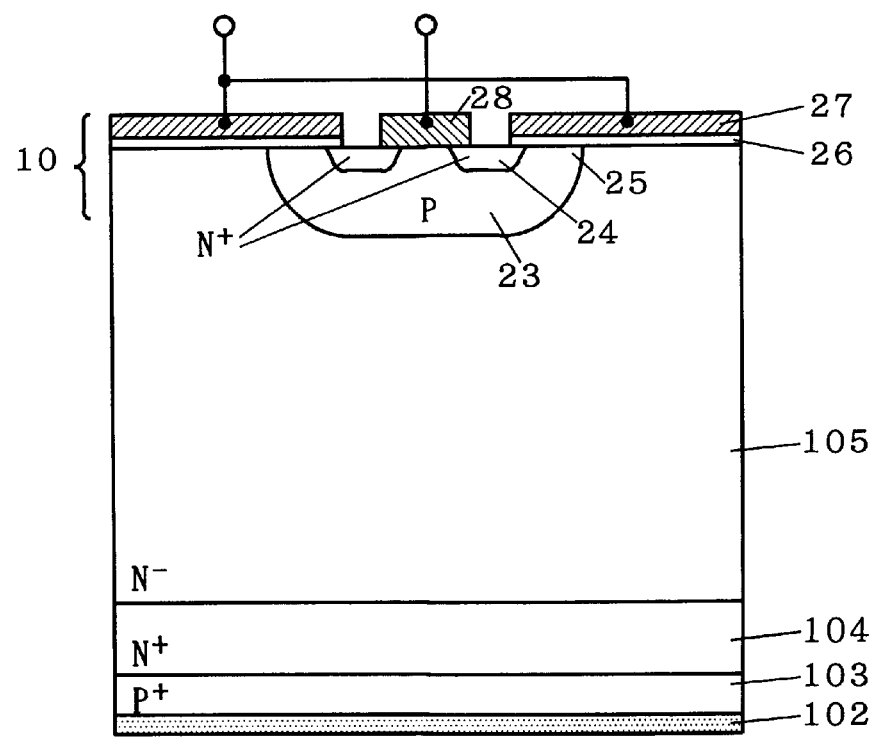

Next, in the process step shown in FIG. 8, the MOS region 10 is formed on the upper main surface side of the N⁻ layer 105. Then the collector electrode 106 is formed on the lower main surface of the damaged layer 102, and the IGBT 100 shown in FIG. 1 is thus completed. The P⁺ collector layer 103 may be formed when forming the MOS region 10.

<1-3. Characteristic Functions and Effects>

As have been described so far, the damaged layer 102 is formed in the IGBT 100 at the beginning of the fabrication process, and the N⁺ buffer layer 104, the P+collector layer 103, the P base region 23, and the N⁺ emitter regions 24 are formed after that. Accordingly, heavy metal impurities are captured by gettering in the thermal treatments for forming the diffusion layers, thus enabling ensured gettering of heavy metal impurities.

That is to say, for example, gettering is effected for 20 hours when forming the N⁺ buffer layer 104 and for one hour when forming the P⁺ collector layer 103. Hence, even if heavy metal impurities are introduced when the N⁺ buffer layer 104 and the P⁺ collector layer 103 are formed, they are captured in the crystal defects contained in the damaged layer 102. Hence, since heavy metal impurities do not increase in the semiconductor layers related to operation of the IGBT 100, carrier life time becomes longer to reduce the electric resistance of the N⁻ layer 105, which enables reduction in the ON-state voltage.

When forming the MOS region 10, heavy metal impurities can be captured by gettering in the thermal treatments for forming the P base region 23 and the N+emitter regions 24 (e.g., at temperatures of about 1200° C. or lower).

Figure 9:
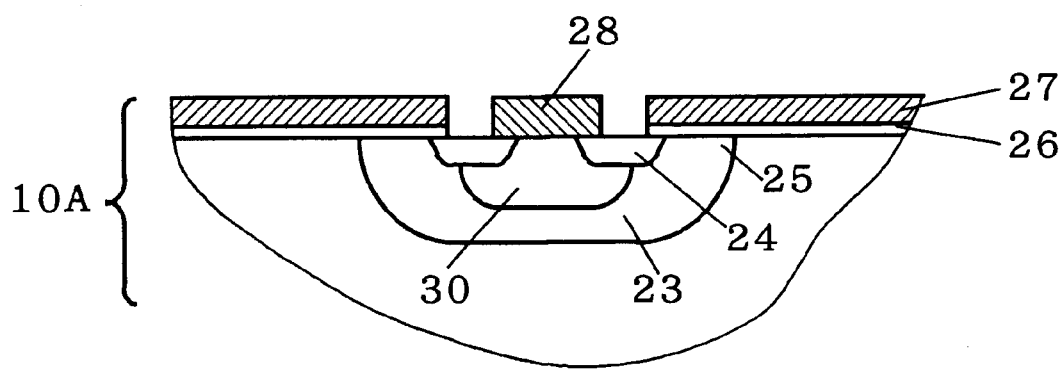
FIGS. 9 and 10 show examples of the structure of the MOS region.
Figure 10:
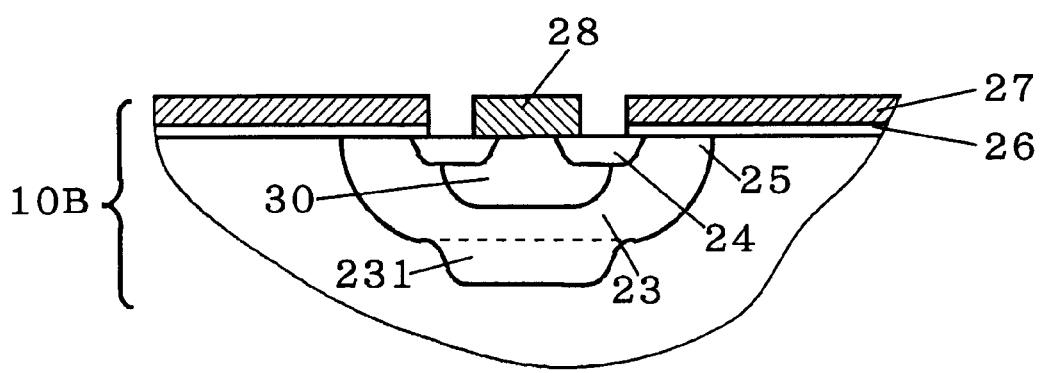

Although only a basic structure of an MOSFET has been disclosed for the MOS region 10 shown in FIG. 1, this part may have the structure shown in FIG. 9 or FIG. 10.

FIG. 9 shows an MOS region 10A further including a P⁺ layer 30 for improving the latchup resistance formed under the surface of the P base region 23. The P⁺ layer 30 is formed to cover the opposing ends of the pair of N⁺ emitter regions 24. In other respects, this structure is the same as that of the MOS region 10. Although formation of the P⁺ layer 30 requires an additional thermal treatment, it raises no problem because gettering comes into effect at the same time.

FIG. 10 shows an MOS region 10B including the P⁺ layer 30 for improving the latchup immunity in the surface of the P base region 23, and further including a P layer 231 in junction with the P base region 23 in the center of the P base region 23 and diffused in the position deeper than the P base region 23. This structure is in other respects the same as the MOS region 10. With the presence of the P⁺ layer 30 and the P layer 231, formation of the Pi layer 30 requires an additional thermal treatment, but gettering is effected at the same time and no problem is encountered.

In the IGBT 100, the collector electrode 106 is formed on the damaged layer 102 without removing the damaged layer 102 after the gettering process for the heavy metal impurities is finished. This structure reduces the contact resistance between the collector electrode 106 and the damaged layer 102.

Figure 11:
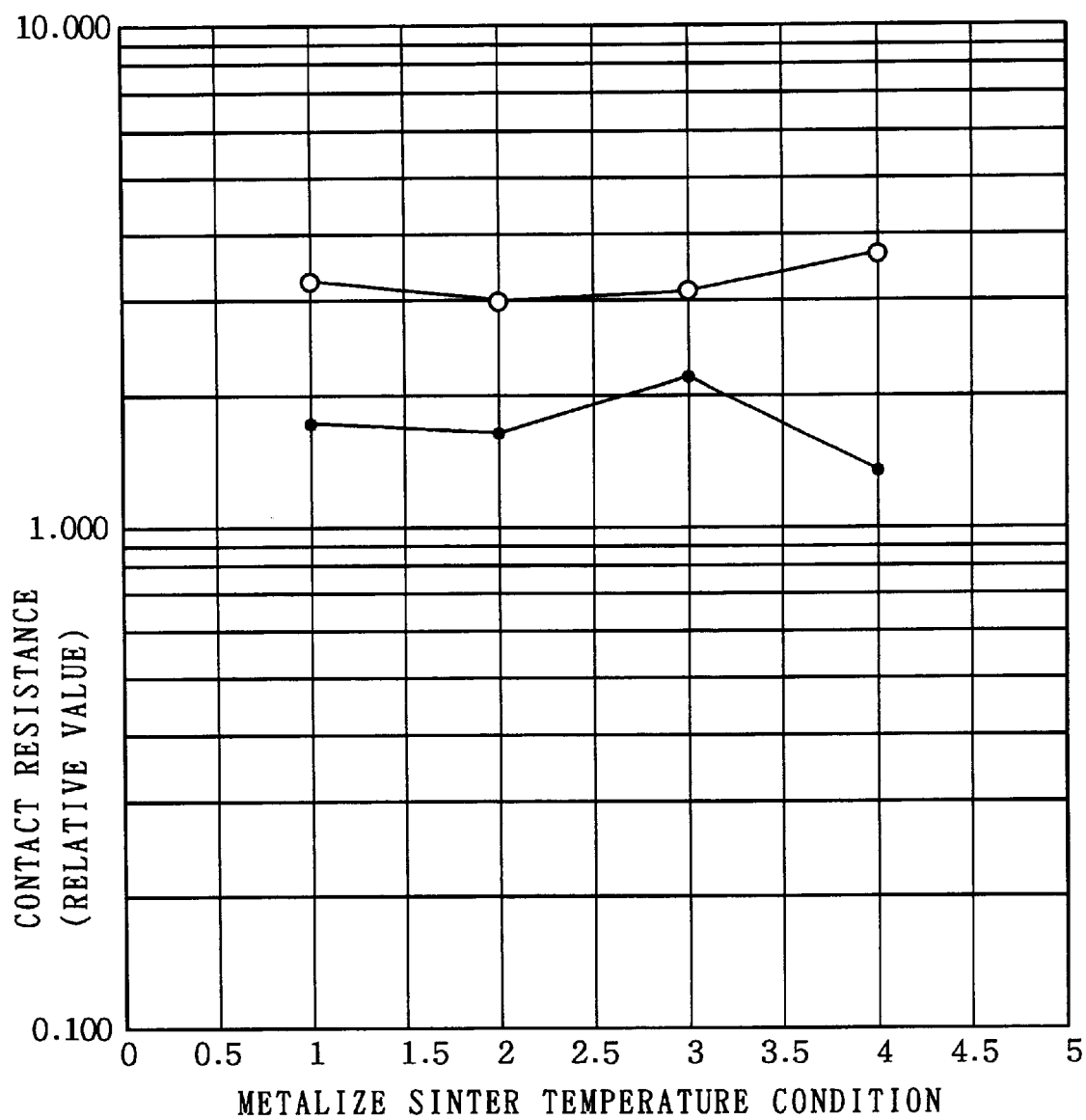
FIG. 11 is a diagram for explaining the contact resistance with the electrode on the damaged layer.

FIG. 11 shows differences in the contact resistance between a structure in which a damaged layer is formed on a main surface of a semiconductor substrate and an electrode is formed on the damaged layer and a structure in which an electrode is formed directly on a main surface of a semiconductor substrate.

In FIG. 11, the horizontal axis shows temperature conditions for metalize sintering of the electrode and the vertical axis shows relative values of the contact resistance. On the horizontal axis, if the sintering temperature of 400° C. is taken as 0, the temperature rise is shown at equal intervals on the basis of that point. The black dots show data in the case where an electrode is formed on a damaged layer and the white circles show data in the case where an electrode is formed directly on a semiconductor substrate.

As can be clearly seen from FIG. 11, the contact resistance is lower in the case where an electrode is formed on a damaged layer. This tendency is unchanged even when the temperature condition for metalize sintering is changed. Table 1 shows the data plotted in FIG. 11.

TABLE 1

| Sintering temperature | Contact resistance relative value (on substrate) | Contact resistance relative value (on damaged layer) |
| --- | --- | --- |
| 1 | 3.306 | 1.736 |
| 2 | 2.975 | 1.653 |
| 3 | 3.140 | 2.149 |
| 4 | 3.719 | 1.405 |

It is considered that the contact resistance thus becomes lower when the electrode is formed on the damaged layer because irregularities formed on the surface of the damaged layer by sandblasting increase the contact area with the electrode. Thus reducing the contact resistance with respect to the electrode reduces the ON-state voltage, which provides an IGBT with a still lower ON-state voltage in cooperation with the effect of reducing the ON-state voltage by gettering of heavy metal impurities.

<Second Preferred Embodiment>

<2-1. Device Structure>

Figure 12:
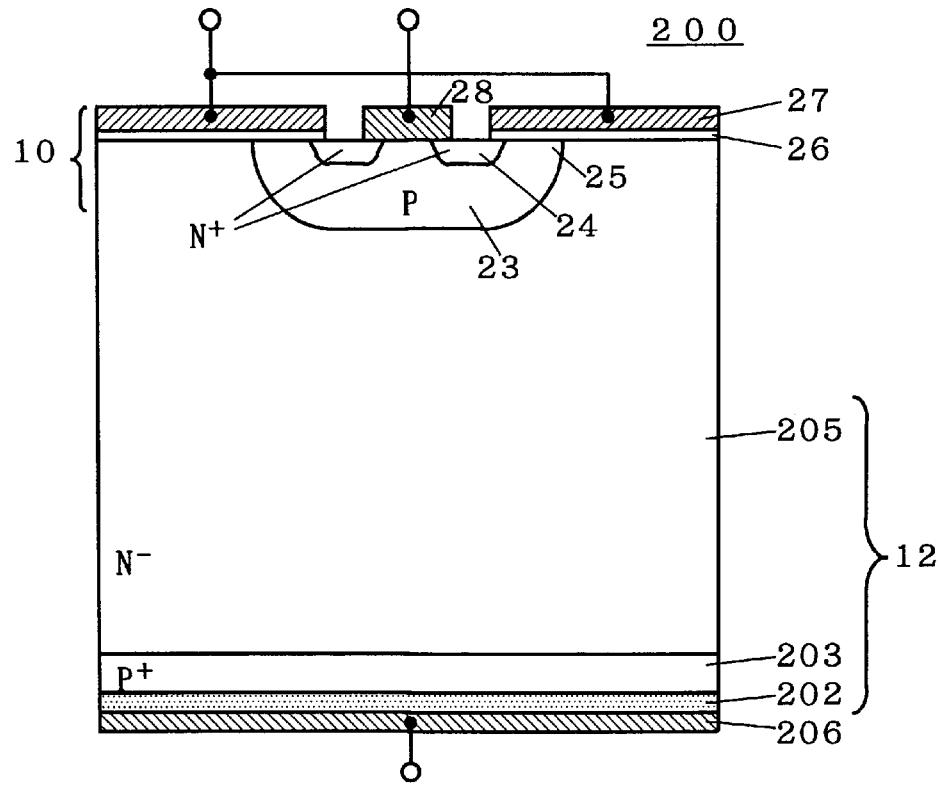
FIG. 12 is a cross-sectional view showing the structure of a semiconductor device according to a second preferred embodiment of the present invention.
Figure 13:
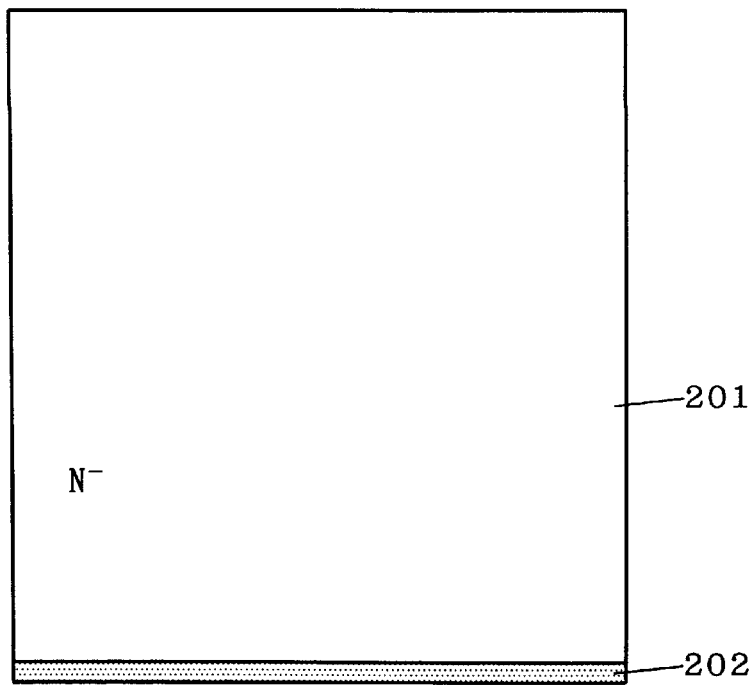
FIGS. 13 to 17 are cross-sectional views showing the process of manufacturing the semiconductor device of the second preferred embodiment of the present invention.

FIG. 12 shows a cross-sectional structure of an insulated-gate bipolar transistor (hereinafter referred to simply as an IGBT) 200 as a second preferred embodiment of the present invention.

As shown in FIG. 12, the IGBT 200 includes a semiconductor base body 12 formed of a damaged layer 202 serving as a gettering layer, a P⁺ collector layer 203 (the second semiconductor layer), and an N⁻ layer 205 (the first semiconductor layer) laid one on top of another, the gate electrode 27 selectively formed on the upper main surface of the semiconductor base body 12, specifically on the external main surface of the N⁻ layer 205 with the gate insulating film 26 interposed therebetween, the emitter electrode 28 (the second main electrode) selectively formed on the upper main surface of the semiconductor base body 12, and a collector electrode 206 (the first main electrode) formed on the lower main surface of the semiconductor base body 12, specifically on the external main surface of the damaged layer 202.

The same structural components as those in the IGBT 100 described referring to FIG. 1 are shown at the same reference characters and are not described again here.

<2-2. Fabrication Method>

Next, a method for fabricating the IGBT 200 will be described referring to FIGS. 13 to 18. First, in the process step shown in FIG. 13, a single-crystal silicon substrate 201 containing N-type impurities at a relatively low concentration is prepared and its lower main surface (the side on which the collector electrode is formed later) is sandblasted to form the damaged layer 202 having mechanically formed crystal defects.

Figure 14:
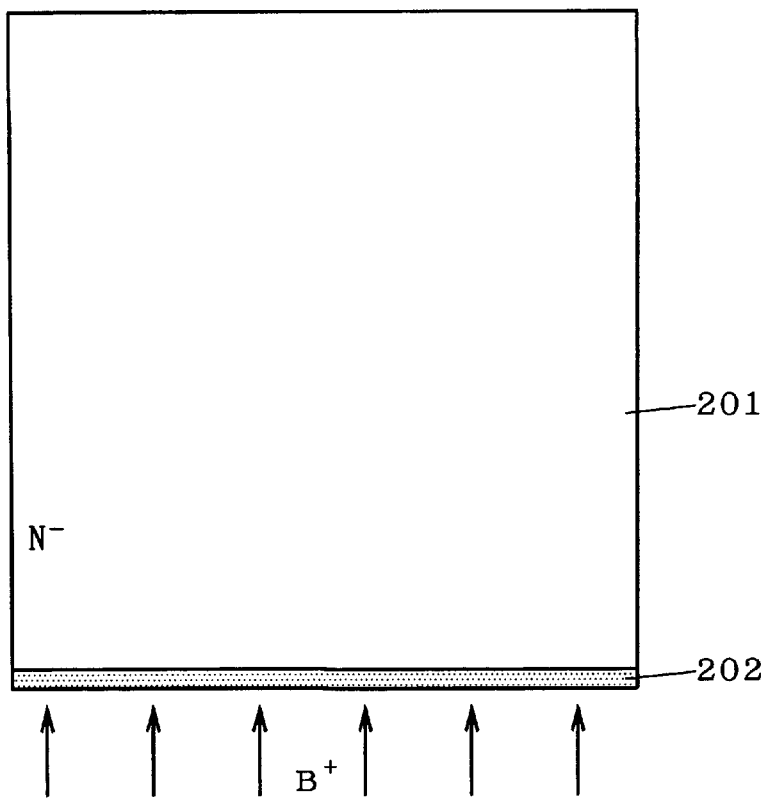

Next, in the process step shown in FIG. 14, boron ions are introduced from the lower main surface side of the silicon substrate 201 by an ion implantation to a dose of about $1 \times 10^3/cm^2$, for example.

Figure 15:
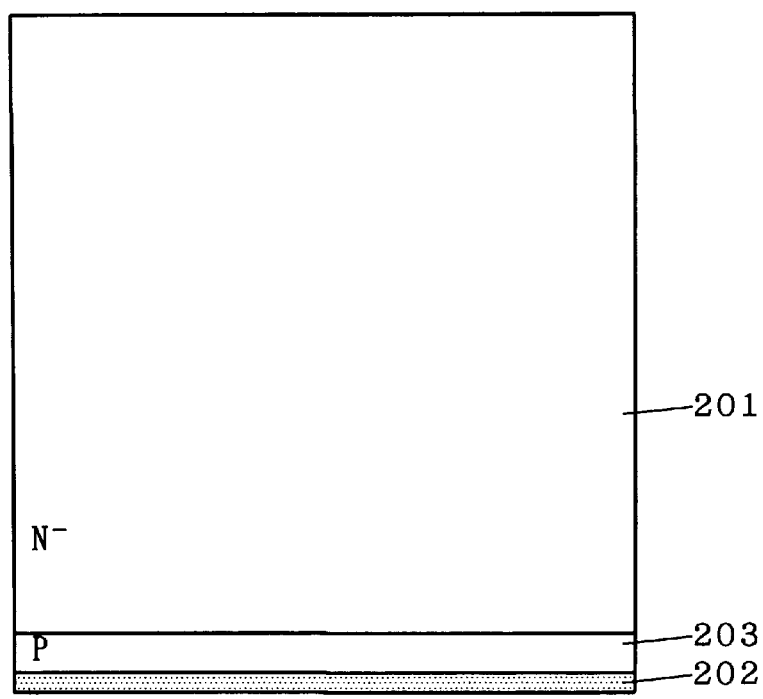

Next, in the process step shown in FIG. 15, the implanted boron ions are diffused by a thermal diffusion to form the P⁺ collector layer 203. The diffusion depth of the P⁺ collector layer 203 is 10 μm or smaller, and preferably about 1 to 6 μm. The diffusion is performed under conditions of 1100° C., about one hour, in the case of formation before formation of the MOS region 10.

Figure 16:
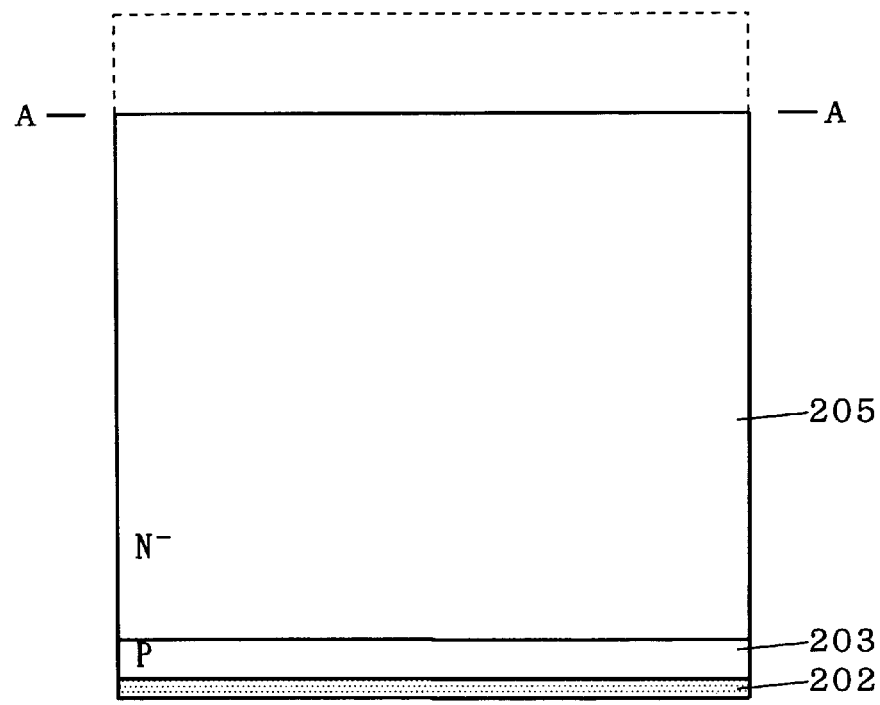

Next, in the process step shown in FIG. 16, the upper main surface of the silicon substrate 201 (the side on which the emitter electrode is formed later) is removed to a certain thickness as shown by the line A—A to remove oxide film attached in the preceding process steps and P layer formed by roundabout penetration of ions in the formation of the diffusion layer. The remaining part of the silicon substrate 201 serves as the N⁻ layer 205. Obtaining a breakdown voltage of about 2000 V with the IGBT 200 requires that the N⁻ layer 205 has a thickness of at least 200 μm.

Figure 17:
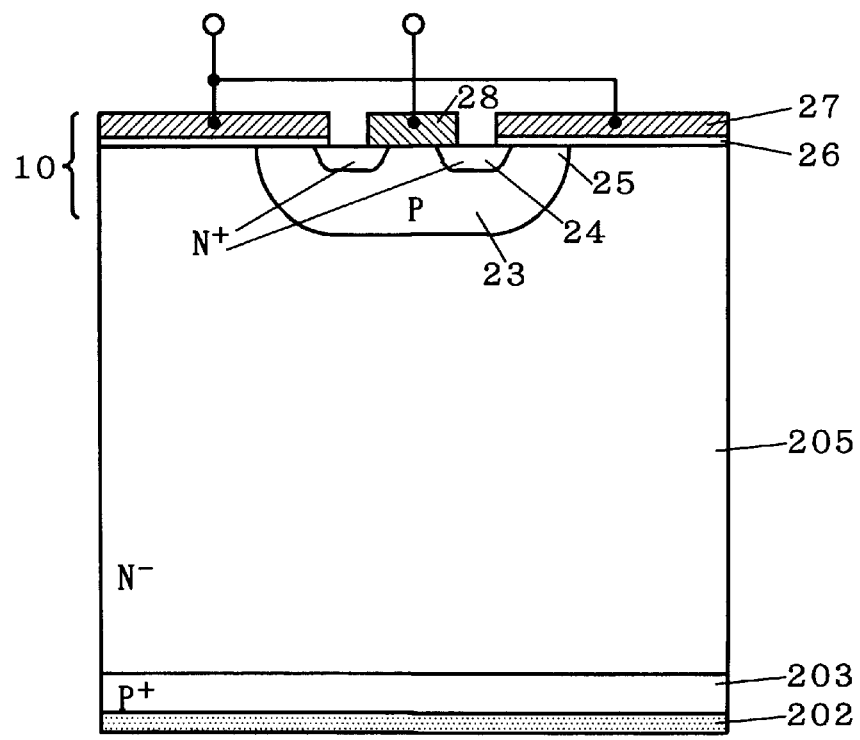

Next, in the process step shown in FIG. 17, the MOS region 10 is formed on the upper main surface side of the N⁻ layer 205. Then the collector electrode 206 is formed on the lower main surface of the damaged layer 202, and the IGBT 200 shown in FIG. 12 is thus completed. The P⁺ collector layer 203 may be formed when forming the MOS region 10.

<2-3. Characteristic Functions and Effects>

As have been described so far, the damaged layer 202 is formed on the IGBT 200 at the beginning of the fabrication process, and the P⁺ collector layer 203, the P base region 23, and the N⁺ emitter regions 24 are formed after that. Accordingly, heavy metal impurities are captured by gettering in the thermal treatments for forming the diffusion layers, thus enabling ensured gettering of heavy metal impurities.

That is to say, for example, gettering is effected for about 30 minutes when the P⁺ collector layer 203 is formed. Hence, even if heavy metal impurities are introduced when forming the P⁺ collector layer 203, they are captured in the crystal defects contained in the damaged layer 202. Hence, since heavy metal impurities do not increase in the semiconductor layers related to operation of the IGBT 200, the electric resistance of the N⁻ layer 205 can be reduced to reduce the ON-state voltage.

The effect of gettering in the thermal treatments for forming the P base region 23 and the N⁺ emitter regions 24 when forming the MOS region 10, and the formation of the MOS regions 10A and 10B shown in FIG. 9 and FIG. 10 in place of the MOS region 10 are not repeatedly described, since they have already been described in the first preferred embodiment.

Further, the effect that the contact resistance between the collector electrode 206 and the damaged layer 202 can be reduced to further reduce the ON-state voltage by forming the collector electrode 206 on the damaged layer 202 without removing the damaged layer 202 after the gettering process for heavy metal impurities is not described again here, since it is the same as that of the IGBT 100 described in the first preferred embodiment.

<Third Preferred Embodiment>

<3-1. Device Structure>

Figure 18:
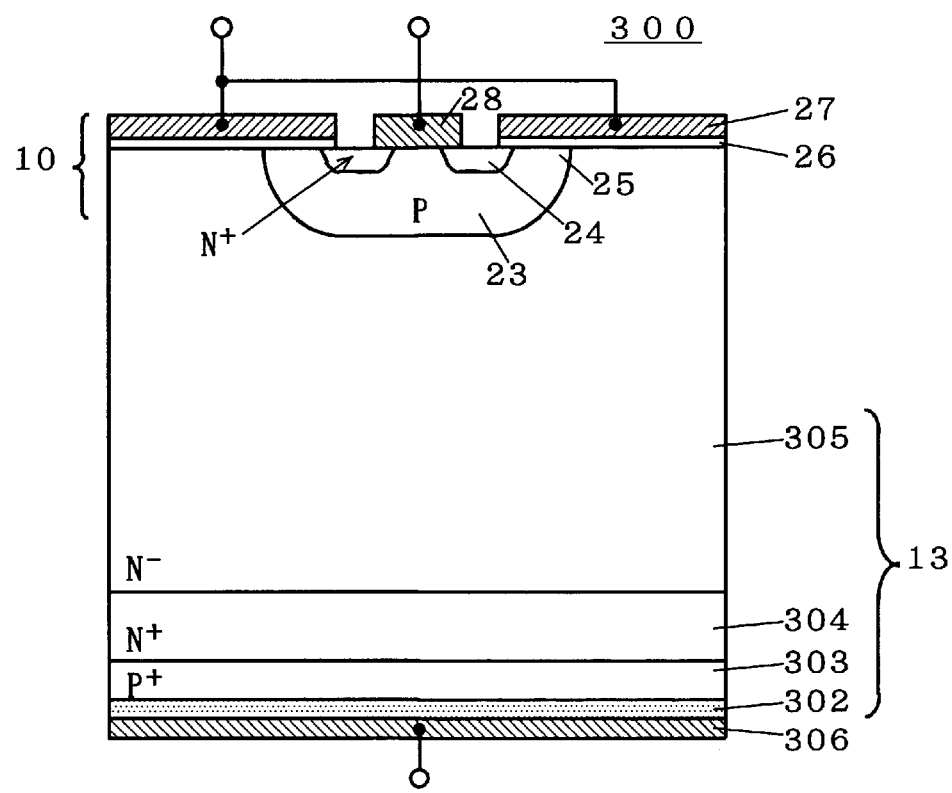
FIG. 18 is a cross-sectional view showing the structure of a semiconductor device according to a third preferred embodiment of the present invention.
Figure 19:
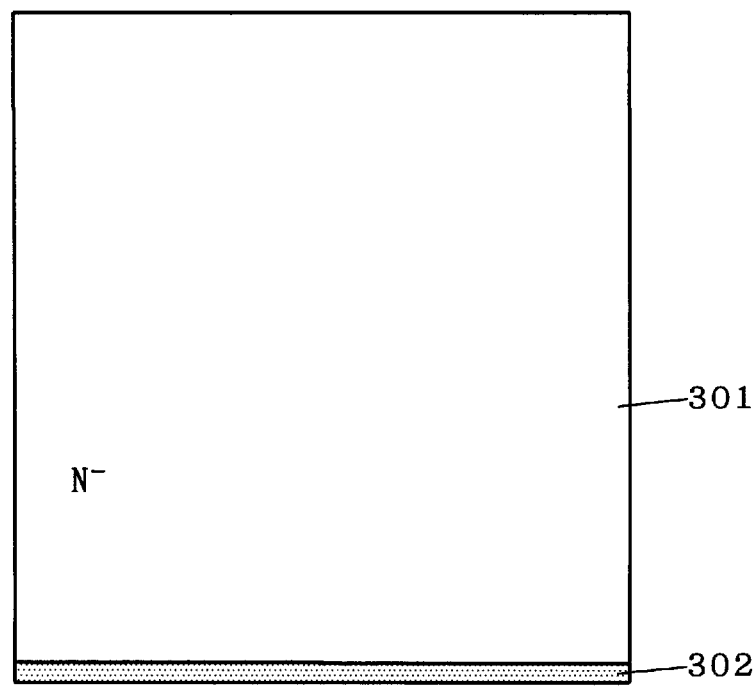
FIGS. 19 to 25 are cross-sectional views for describing the process of manufacturing the semiconductor device of the third preferred embodiment of the present invention.

FIG. 18 shows a cross-sectional structure of an insulated-gate bipolar transistor (hereinafter referred to simply as an IGBT) 300 as a third preferred embodiment of the present invention.

As shown in FIG. 18, the IGBT 300 includes a semiconductor base body 13 formed of a polysilicon layer 302 serving as a gettering layer, a Pi collector layer 303 (the second semiconductor layer), an N⁺ buffer layer 304 (the third semiconductor layer), and an N⁻ layer 305 (the first semiconductor layer) laid one on top of another, the gate electrode 27 selectively formed on the upper main surface of the semiconductor base body 13, specifically on the external main surface of the N⁻ layer 305 with the gate insulating film 26 interposed therebetween, the emitter electrode 28 (the second main electrode) selectively formed on the upper main surface of the semiconductor base body 13, and a collector electrode 306 (the first main electrode) formed on the lower main surface of the semiconductor base body 13, specifically on the external main surface of the polysilicon layer 302.

The same structural components as those in the IGBT 100 described referring to FIG. 1 are shown at the same reference characters and not described again.

<3-2. Fabrication Method>

Next, a method for fabricating the IGBT 300 will be described referring to FIGS. 19 to 25. First, in the process step shown in FIG. 19, a single-crystal silicon substrate 301 containing N-type impurities at a relatively low concentration is prepared and the polysilicon layer 302 is formed by CVD, for example, on its lower main surface (the side on which the collector electrode is formed later).

Figure 20:
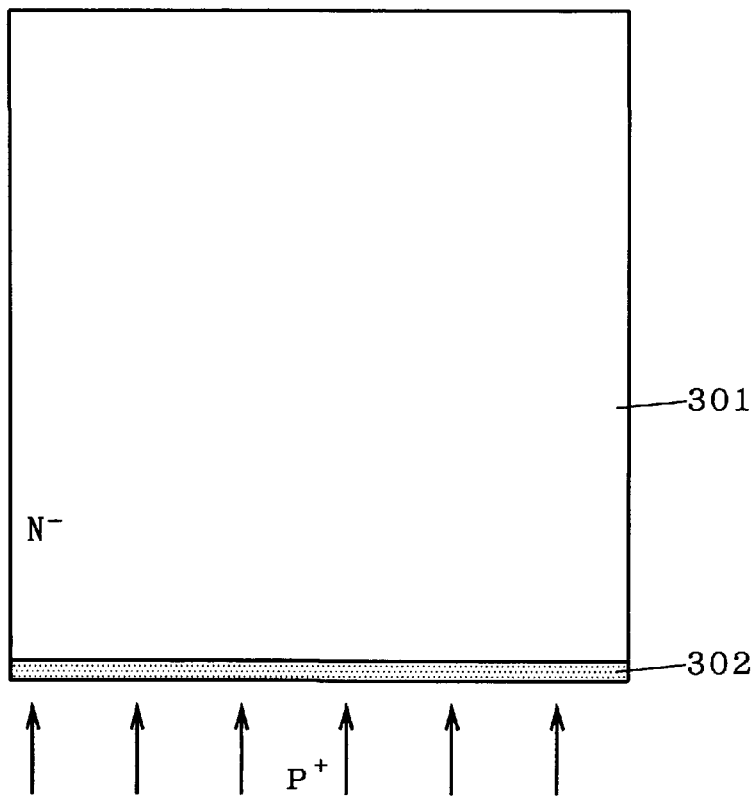

Next, in the process step shown in FIG. 20, phosphorus ions are introduced from the lower main surface side of the silicon substrate 301 by an ion implantation to a dose of about $1 \times 10^{14}/cm^2$, for example.

Figure 21:
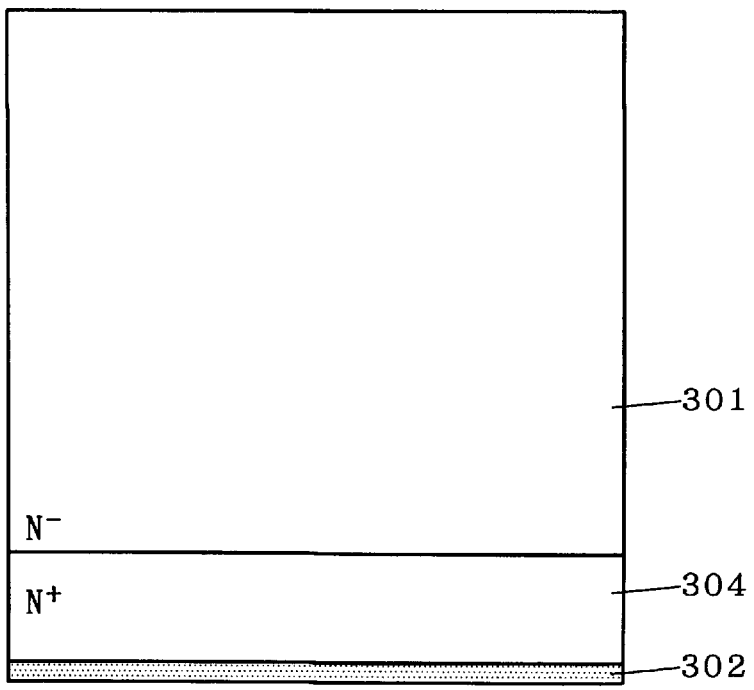

Next, in the process step shown in FIG. 21, the implanted phosphorus ions are diffused by a thermal diffusion to form the N⁺ buffer layer 304. The diffusion depth of the N⁺ buffer layer 304 is about 20 μm, for example, and the diffusion conditions include 1200° C., about 20 hours, plus the total of those in the thermal treatment for forming the P+ collector layer and the thermal treatments for forming the MOS region 10 described later.

Figure 22:
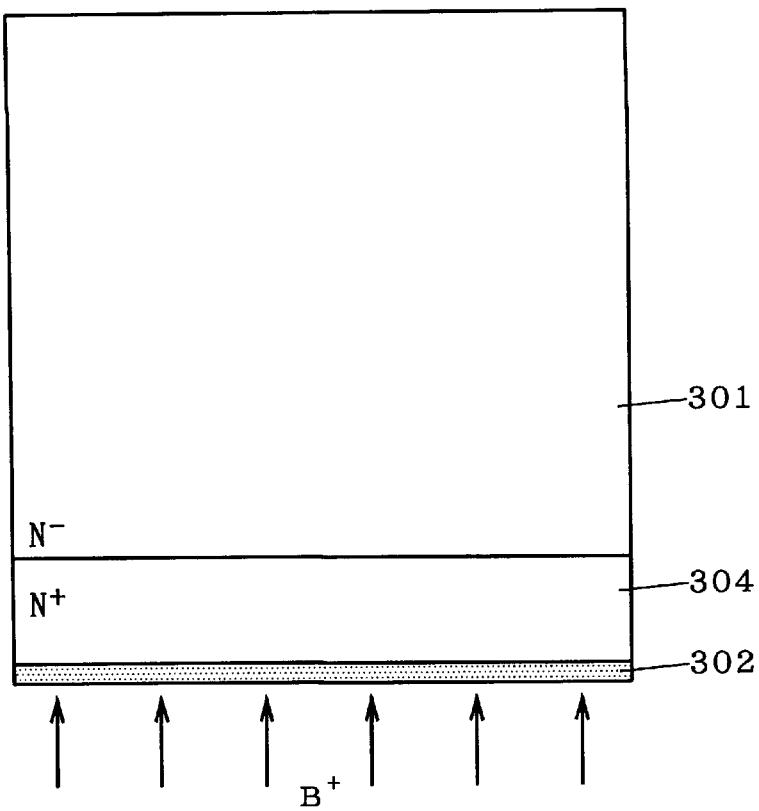

Next, in the process step shown in FIG. 22, boron ions are introduced from the lower main surface side of the silicon substrate 301 by an ion implantation to a dose of about $1 \times 10^{15}/cm^2$, for example.

Figure 23:
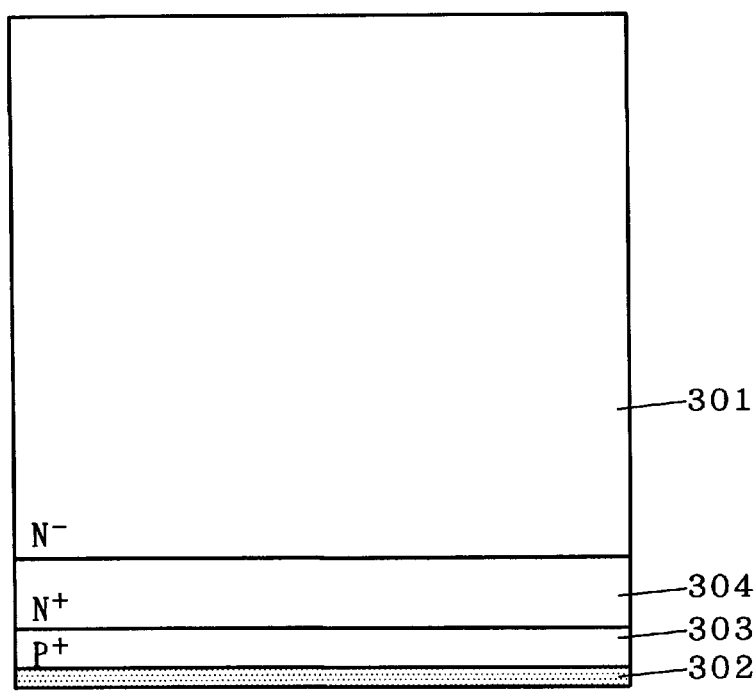

Next, in the process step shown in FIG. 23, the implanted boron ions are diffused by a thermal diffusion to form the P+ collector layer 303. The diffusion depth of the P+ collector layer 303 is 10 µm or smaller, and preferably is about 1 to 6 µm. The diffusion conditions include a temperature of 1100° C., one hour, plus those in the thermal treatments for forming the MOS region 10.

Figure 24:
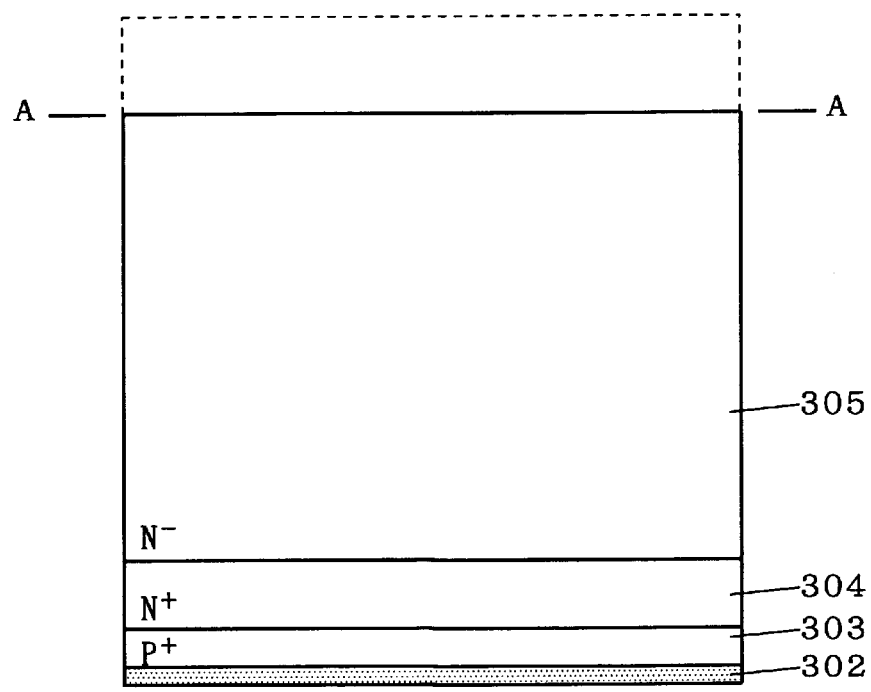

Next, in the process step shown in FIG. 24, the upper main surface of the silicon substrate 301 (the side on which the emitter electrode is formed later) is removed to a certain thickness as shown by the line A—A to remove oxide film attached in the preceding process steps and N and P layers formed by roundabout penetration of ions in formation of the diffusion layers. The remaining part of the silicon substrate 301 serves as the N− layer 305. Obtaining a breakdown voltage of about 2000 V with the IGBT 300 requires that the N− layer 305 has a thickness of 150 µm or larger.

Figure 25:
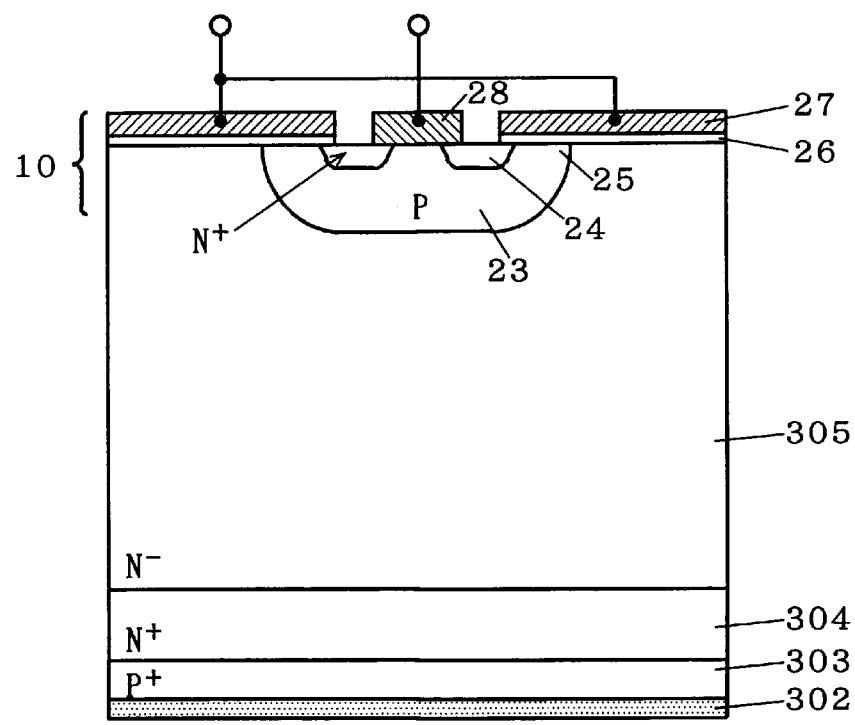

Next, in the process step shown in FIG. 25, the MOS region 10 is formed on the upper main surface side of the N− layer 305. Then the collector electrode 306 is formed on the lower main surface of the polysilicon layer 302, and the IGBT 300 shown in FIG. 18 is thus completed. The P+ collector layer 303 may be formed when forming the MOS region 10.

<3-3. Characteristic Functions and Effects>

As have been described so far, the polysilicon layer 302 is formed on the IGBT 300 at the beginning of the fabrication process, and the N+ buffer layer 304, the P+ collector layer 303, the P base region 23, and the N+ emitter regions 24 are formed after that. Accordingly, heavy metal impurities are captured by gettering in the thermal treatments for forming the diffusion layers, thus enabling ensured gettering of heavy metal impurities.

That is to say, for example, gettering is effected for 20 hours when forming the N+ buffer layer 304 and for one hour when forming the P+ collector layer 303. Hence, even if heavy metal impurities are introduced when the N+ buffer layer 304 and the P+ collector layer 303 are formed, they are captured in the crystal defects contained in the polysilicon layer 302. Hence, since heavy metal impurities do not increase in the semiconductor layers related to operation of the IGBT 300, the electric resistance of the N− layer 305 can be reduced to reduce the ON-state voltage.

The effect of gettering in the thermal treatments for forming the P base region 23 and the N+ emitter regions 24 in forming the MOS region 10, and the formation of the MOS regions 10A and 10B shown in FIG. 9 and FIG. 10 in place of the MOS region 10 are not repeatedly described, since they have already been described in the first preferred embodiment.

Even when the polysilicon layer 302 is formed as an undoped polysilicon layer in the first stage, impurities are introduced into the polysilicon layer when the N+ buffer layer 304 and the P+ collector layer 303 are formed. Accordingly, the resistance of the polysilicon layer 302 can be made small without the necessity of intentionally introducing impurities.

In the IGBT 300, the collector electrode 306 is formed on the polysilicon layer 302 without removing the polysilicon layer 302 after the gettering process for the heavy metal impurities is finished. This structure reduces the contact resistance between the collector electrode 306 and the polysilicon layer 302 to further reduce the ON-state voltage of the IGBT 300.

Figure 26:
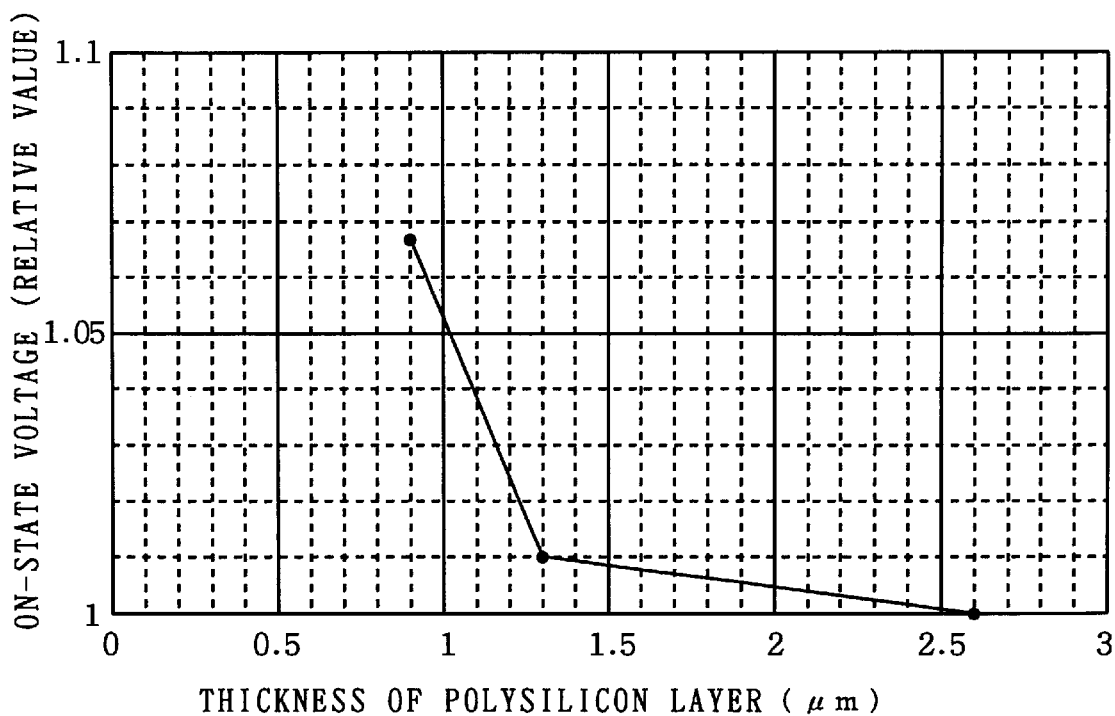
FIGS. 26 and 27 illustrate the relation between the thickness of the polysilicon layer and the ON-state voltage.
Figure 27:
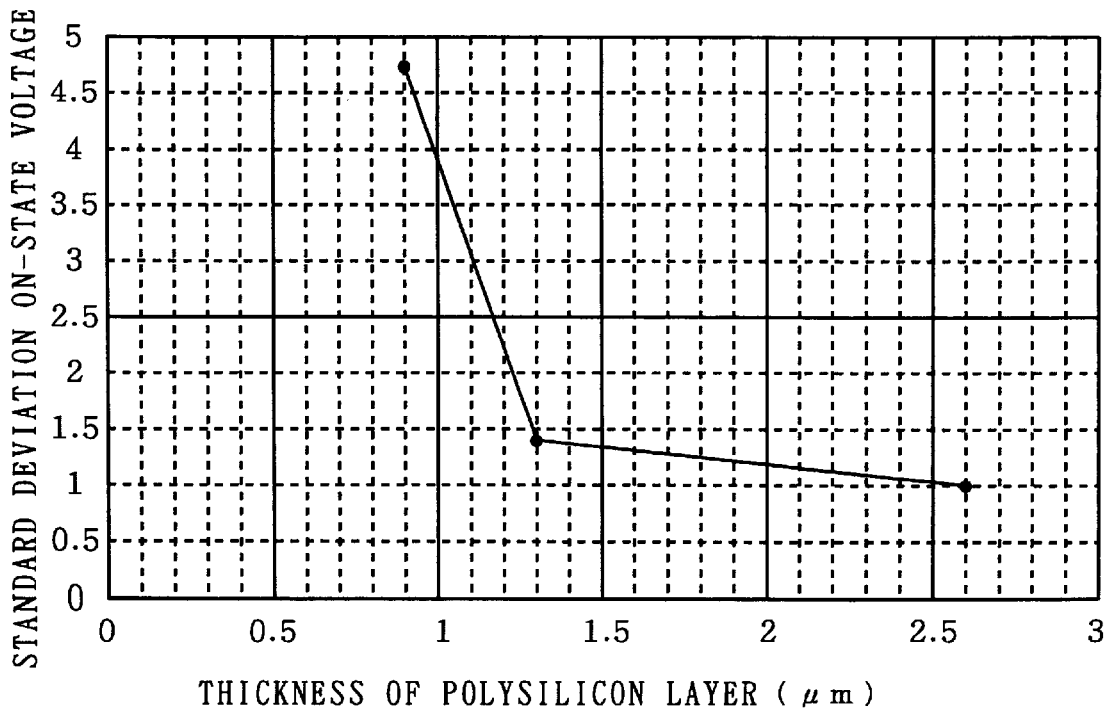

Now, measurements for the most suitable thickness of the polysilicon layer 302 are shown in FIG. 26 and FIG. 27. FIG. 26 shows relative values of the ON-state voltage of the IGBT 300 versus the thickness of the polysilicon layer 302, where the horizontal axis shows the thickness of the polysilicon layer and the vertical axis shows the relative values of the ON-state voltage.

FIG. 27 shows standard deviation of the ON-state voltage of the IGBT 300 versus the thickness of the polysilicon layer 302, where the horizontal axis shows the thickness of the polysilicon layer and the vertical axis shows the standard deviation of the ON-state voltage.

As can be clearly seen from FIG. 26 and FIG. 27, the ON-state voltage rapidly decreases as the thickness of the polysilicon layer 302 becomes 0.9 µm or larger, and the rate of the decrease in the ON-state voltage becomes slower when it becomes 1.3 µm or larger. This shows that the thickness of the polysilicon layer 302 should be 0.9 µm or larger to obtain the effect of reducing the ON-state voltage, and that it should be 1.3 µm or larger to reduce variations in the ON-state voltage. Table 2 shows the data plotted in FIG. 26 and FIG. 27.

TABLE 2

| Thickness of polysilicon layer | Average of ON voltage (rel. value) | Thickness of polysilicon layer | Standard deviation of ON voltage |
| --- | --- | --- | --- |
| 0.9 | 1.066 | 0.9 | 4.71 |
| 1.3 | 1.01 | 1.3 | 1.41 |
| 2.6 | 1 | 2.6 | 1 |

The following consideration is thought to be one reason for the fact that the ON-state voltage of the IGBT 300 is reduced when the collector electrode 306 is formed on a polysilicon layer 302 having a certain thickness: The mean particle diameter of the polysilicon layer 302 is large and the surface of the polysilicon layer 302 is uneven. This increases the contact area with the electrode to reduce the contact resistance with respect to the electrode, and thus to reduce the ON-state voltage. Variations in the ON-state voltage are so large with the thicknesses of the polysilicon layer 302 of 0.9 µm or smaller that no effective data could be obtained. We think that this is attributable to the relation between the mean particle diameter of the polysilicon layer 302 and the thickness of the polysilicon layer 302.

<3-4. Examples of Modifications>

With the IGBT 300 described above, the polysilicon layer 302 is formed over the entire surface of the P+ collector layer 303. However, it is not always necessary to form the polysilicon layer 302 all over the surface.

Figure 28:
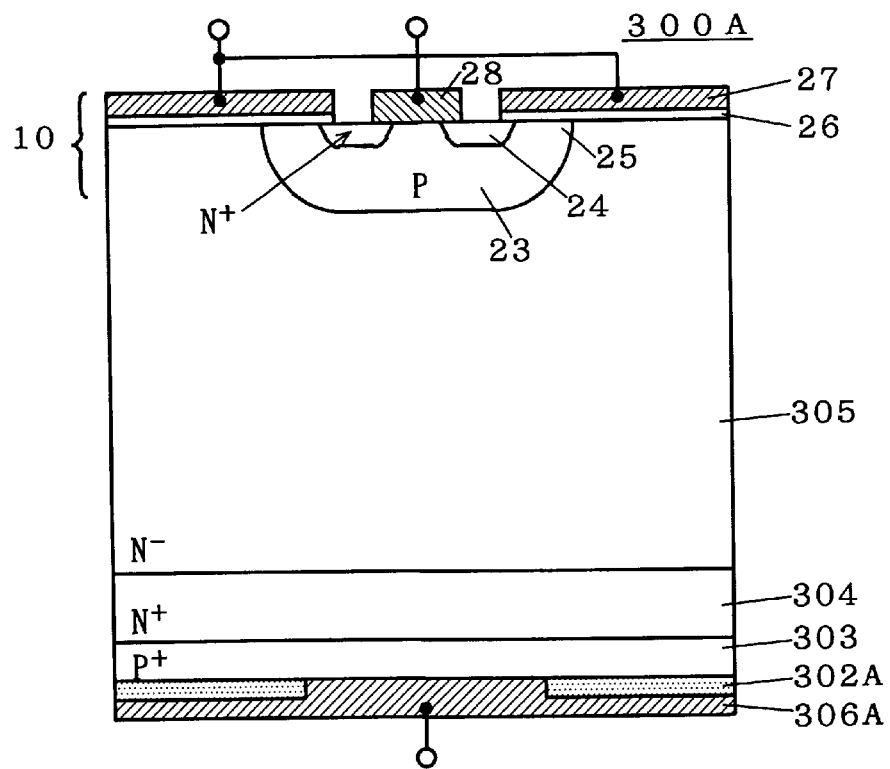
FIG. 28 is a cross-sectional view showing a structure of a modification of the semiconductor device of the third preferred embodiment of the present invention.

FIG. 28 shows an IGBT 300A in which a polysilicon layer 302A as a gettering layer is selectively formed on the external main surface of the P+ collector layer 303.

In FIG. 28, part of the external main surface of the P+ collector layer 303 is not covered with the polysilicon layer 302A, which part is in direct contact with the collector electrode 306A (the first main electrode). This structure is in other respects the same as that of the IGBT 300 explained referring to FIG. 18 and the same structural elements are shown at the same reference characters and are not described again.

Figure 29:
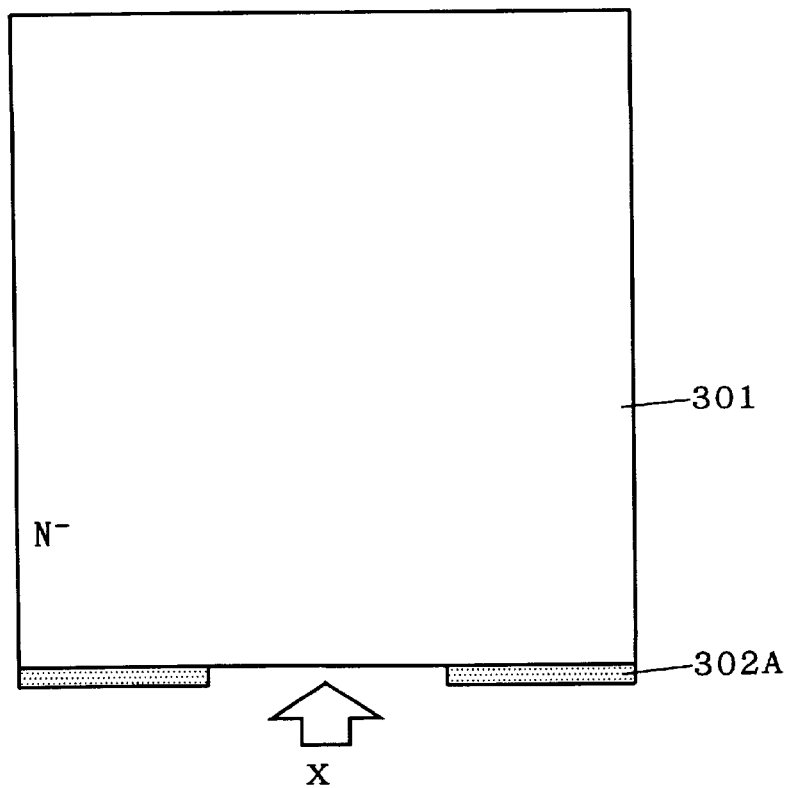
FIG. 29 is a cross-sectional view showing the process of manufacturing the modification of the semiconductor device of the third preferred embodiment of the present invention.

In a method of manufacturing the IGBT 300A, as shown in FIG. 29, with a silicon substrate 301 prepared, a polysilicon layer is formed all over its lower main surface (the side on which the collector electrode is formed later) by CVD, for example, which is patterned by photolithography technology to selectively form the polysilicon layer 302A. This process step is followed by the same process steps as those in the fabrication method for the IGBT 300 described referring to FIGS. 19 to 25 and are not described again here.

Figure 30:
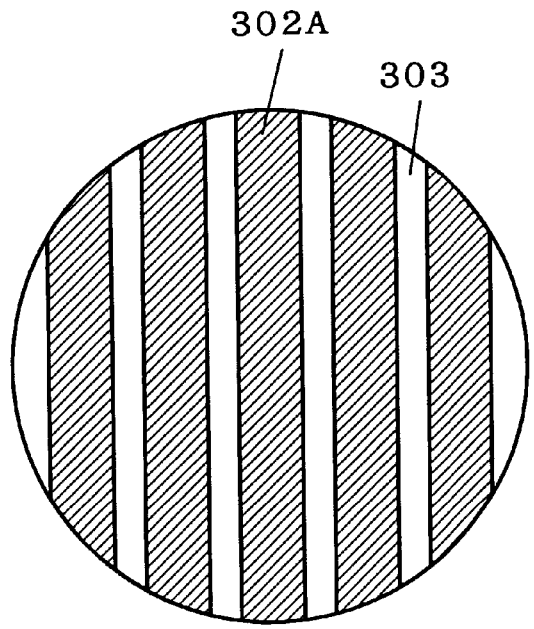
FIGS. 30 and 31 show examples of the plane configuration of the polysilicon layer.

FIG. 30 shows an example of a plane configuration of the polysilicon layer 302A. FIG. 30 is a partial top view of the silicon substrate 301 seen from the direction shown by the arrow X in FIG. 29, specifically seen from the polysilicon layer 302A side. As shown in FIG. 30, the polysilicon layer 302A is formed in the shape of a plurality of independent stripes on the P+ collector layer 303 with the P+collector layer 303 exposed between the stripes. This structure certainly prevents the peripheral edge portion of the semiconductor substrate from bowing in the direction perpendicular to the direction of arrangement of the plurality of stripes.

Figure 31:
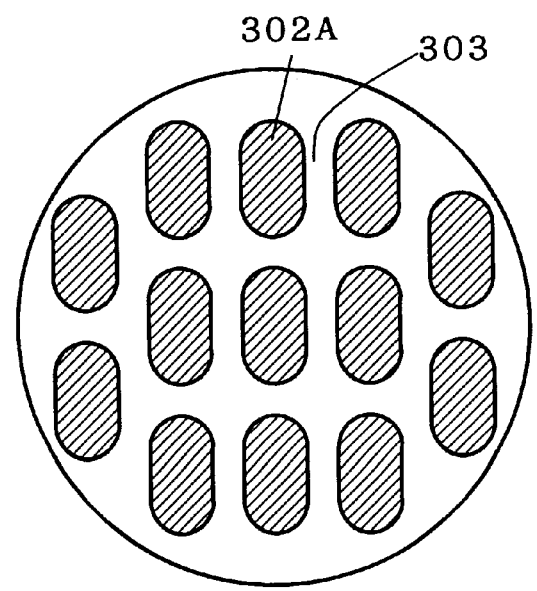

FIG. 31 shows another example of the plane configuration of the polysilicon layer 302A. As shown in FIG. 31, the polysilicon layer 302A is formed in the shape of a plurality of independent oval islands on the Pa collector layer 303, with the P+collector layer 303 exposed among the island-like regions. This structure prevents the peripheral edge portion of the semiconductor substrate from bowing in any part.

Thus selectively forming the polysilicon layer 302A reduces the bow of the substrate due to the presence of the polysilicon layer. That is to say, while the polysilicon layer 302A is formed on the lower main surface of the silicon substrate 301 as shown in FIG. 30, nothing is formed on the opposite, upper main surface. The following thermal diffusion steps are carried out in this situation. As the thermal diffusion process proceeds, oxide film is formed on the polysilicon layer 302A and on the upper main surface of the silicon substrate 301. Since the oxide film has a larger growth rate on the polysilicon layer than on the silicon surface, it is formed thicker on the polysilicon layer 302A. If the polysilicon layer 302A is formed on the entire surface like the polysilicon layer 302 shown in FIG. 19, the difference in thickness of oxide films causes stresses to cause the marginal part of the silicon substrate 301 to bow upwardly. However, forming the polysilicon layer 302A in the form of stripes or islands reduces the stresses, thus preventing the silicon substrate 301 from bowing.

Needless to say, when the polysilicon layer is formed in regions like islands, they may be shaped into rectangles or other configurations, in place of the ovals shown in FIG. 31.

<Fourth Preferred Embodiment>

<4-1. Device Structure>

Figure 32:
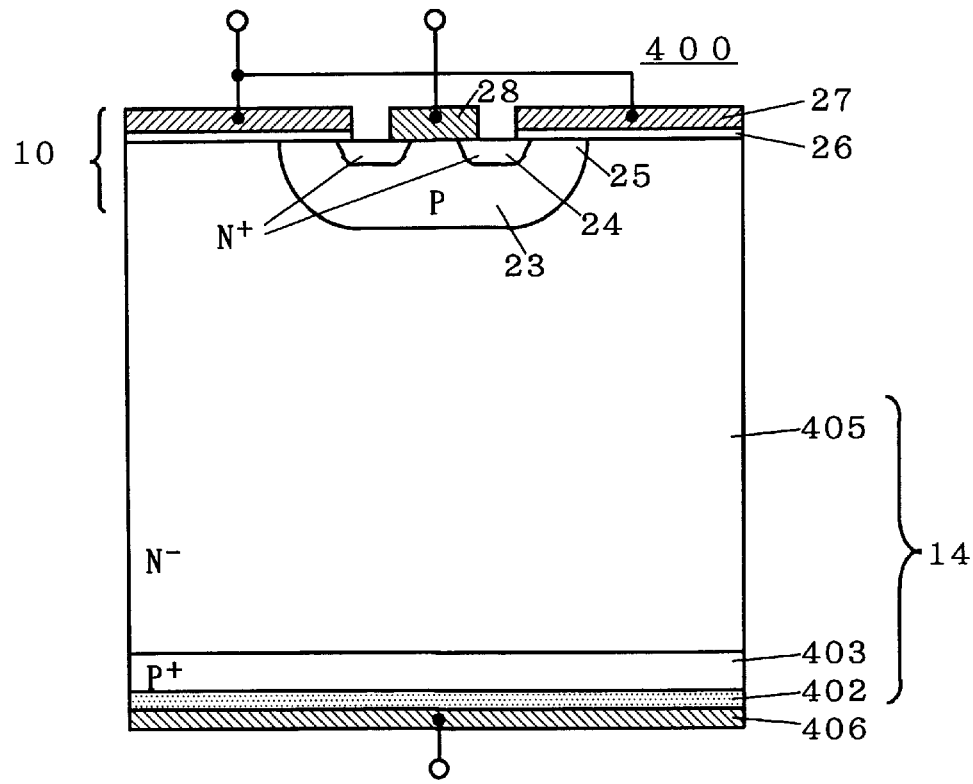
FIG. 32 is a cross-sectional view showing the structure of a semiconductor device according to a fourth preferred embodiment of the present invention.
Figure 33:
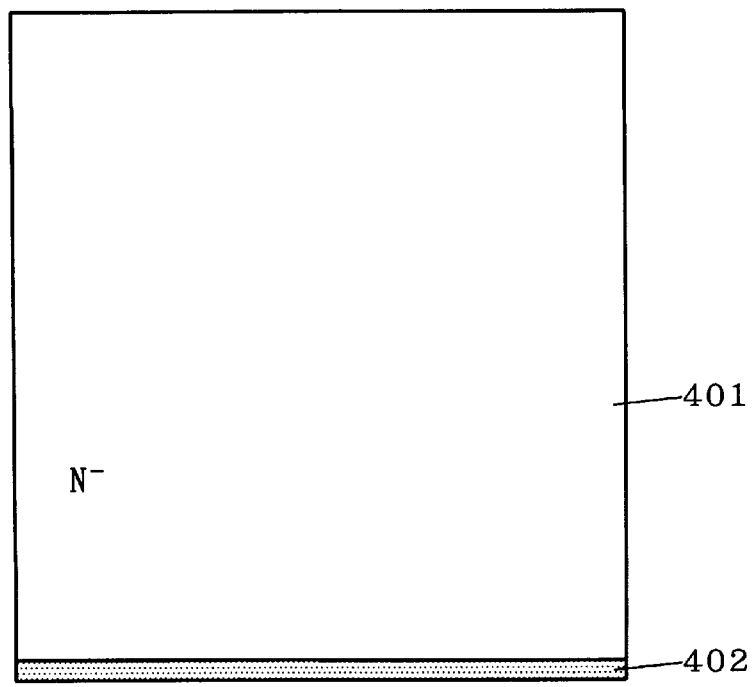
FIGS. 33 to 37 are cross-sectional views showing the process of manufacturing the semiconductor device of the fourth preferred embodiment of the present invention.

FIG. 32 shows a cross-sectional structure of an insulated-gate bipolar transistor (hereinafter referred to simply as an IGBT) 400 as a fourth preferred embodiment of the present invention.

As shown in FIG. 32, the IGBT 400 includes a semiconductor base body 14 formed of a polysilicon layer 402 serving as a gettering layer, a P+ collector layer 403 (the second semiconductor layer), and an N− layer 405 (the first semiconductor layer) laid one on top of another, the gate electrode 27 selectively formed on the upper main surface of the semiconductor base body 14, specifically on the external main surface of the N− layer 405 with the gate insulating film 26 interposed therebetween, the emitter electrode 28 (the second main electrode) selectively formed on the upper main surface of the semiconductor base body 14, and a collector electrode 406 (the first main electrode) formed on the lower main surface of the semiconductor base body 14, specifically on the external main surface of the polysilicon layer 402.

The same structural components as those in the IGBT 100 described referring to FIG. 1 are shown at the same reference characters and are not described again.

<4-2. Fabrication Method>

Next, a method for fabricating the IGBT 400 will be described referring to FIGS. 33 to 37. First, in the process step shown in FIG. 33, a single-crystal silicon substrate 401 containing N-type impurities at a relatively low concentration is prepared and the polysilicon layer 402 is formed by CVD, for example, on its lower main surface (the side on which the collector electrode is formed later).

Figure 34:
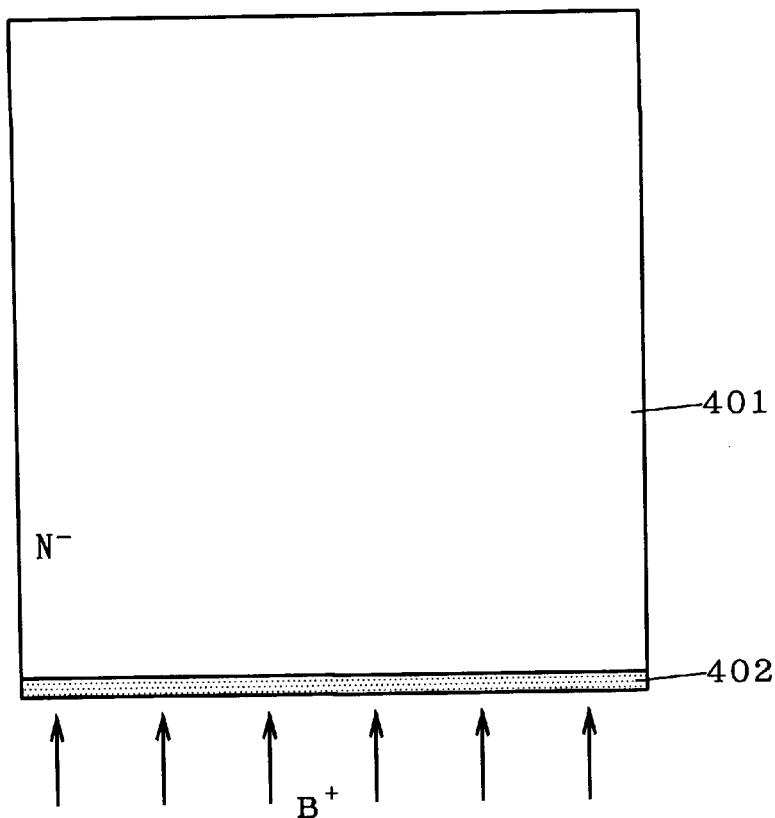

Next, in the process step shown in FIG. 34, boron ions are introduced from the lower main surface side of the silicon substrate 401 by an ion implantation to a dose of about $1 \times 10^{13}/cm^2$, for example.

Figure 35:
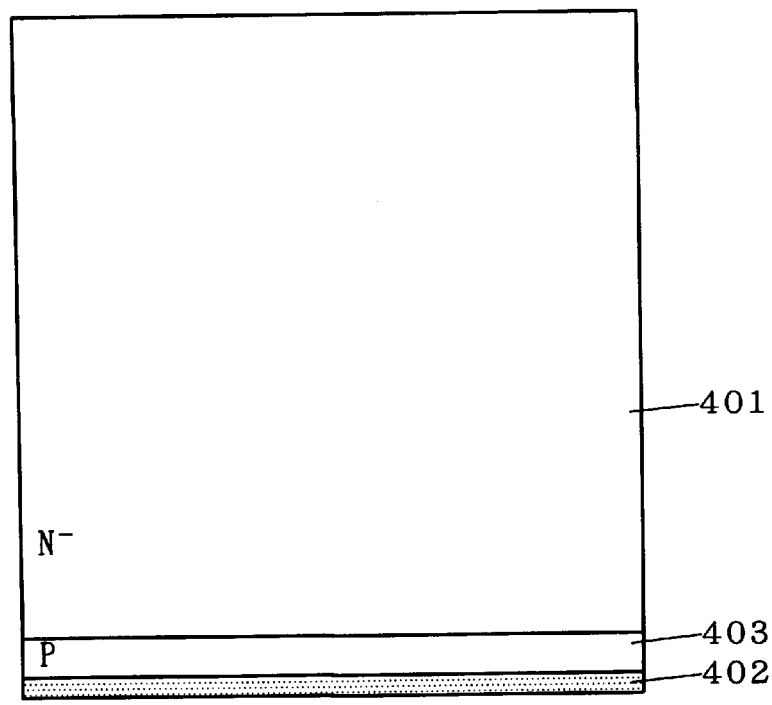

Next, in the process step shown in FIG. 35, the implanted boron ions are diffused by a thermal diffusion to form the P+ collector layer 403. The diffusion depth of the P+ collector layer 403 is equal to or smaller than 10 μm, and preferably is about 1 to 6 μm. The conditions for the thermal treatment are 1100° C., about 1 hour, in the case of formation prior to formation of the MOS region 10.

Figure 36:
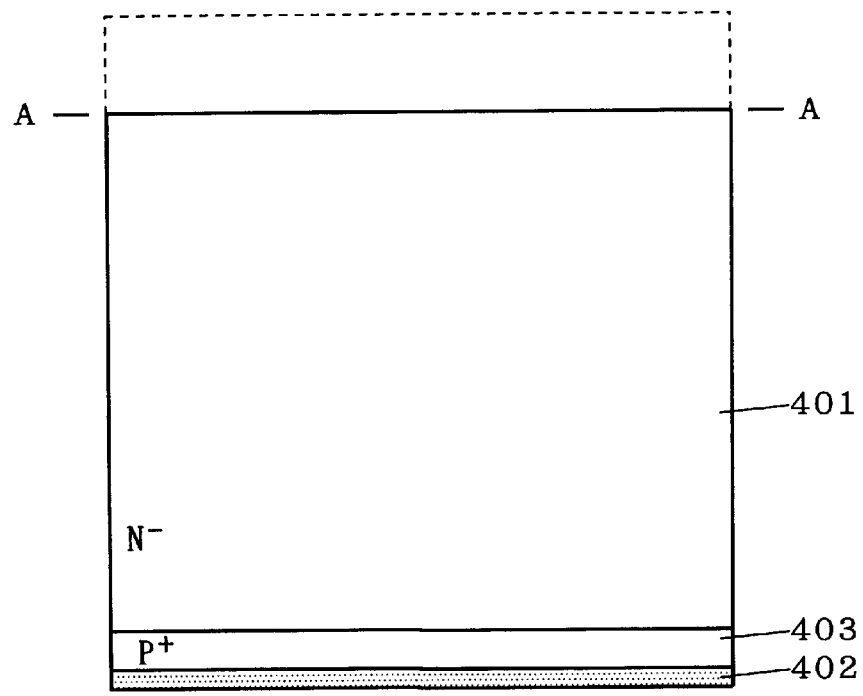

Next, in the process step shown in FIG. 36, the upper main surface of the silicon substrate 401 (the side on which the emitter electrode is formed later) is removed to a certain thickness as shown by the line A—A to remove oxide film attached in the preceding process steps and P layer formed by roundabout penetration of ions in formation of the diffusion layer. The remaining part of the silicon substrate 401 serves as the N− layer 405. Obtaining a breakdown voltage of about 2000 V with the IGBT 400 requires that the N− layer 405 has a thickness of at least 200 μm or larger.

Figure 37:
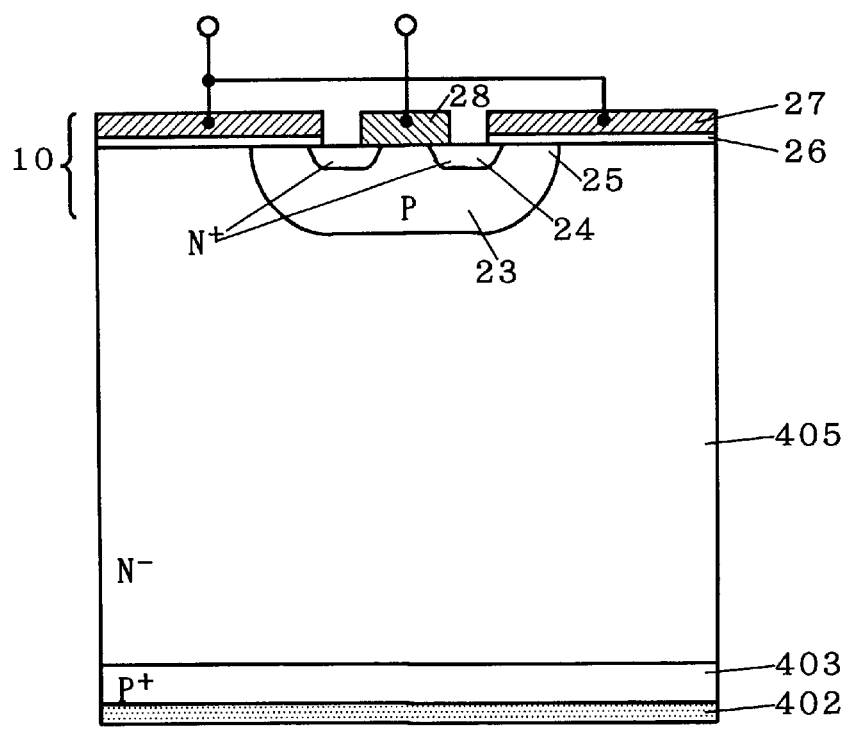

Next, in the process step shown in FIG. 37, the MOS region 10 is formed on the upper main surface side of the N− layer 405. Then the collector electrode 406 is formed on the lower main surface of the polysilicon layer 402, and the IGBT 400 shown in FIG. 32 is thus completed. The P+ collector layer 403 may be formed when forming the MOS region 10.

<4-3. Characteristic Functions and Effects>

As have been described so far, the polysilicon layer 402 is formed on the IGBT 400 at the beginning of the fabrication process, and the P+ collector layer 403, the P base region 23, and the N+ emitter regions 24 are formed after that. Accordingly, heavy metal impurities are captured by gettering in the thermal treatments for forming the diffusion layers, thus enabling ensured gettering of heavy metal impurities.

That is to say, for example, gettering is effected for one hour when forming the P+ collector layer 403. Hence, even if heavy metal impurities are introduced when the P+ collector layer 403 is formed, they are captured in the crystal defects contained in the polysilicon layer 302. Hence, since heavy metal impurities do not increase in the semiconductor layers related to operation of the IGBT 400, the electric resistance of the N− layer 405 can be reduced to reduce the ON-state voltage.

The effect of gettering in the thermal treatments for forming the P base region 23 and the N+ emitter regions 24 when forming the MOS region 10, and the formation of the MOS regions 10A and 10B shown in FIG. 9 and FIG. 10 in place of the MOS region 10 are not repeatedly described, since they have already been described in the first preferred embodiment.

In the IGBT 400, the collector electrode 406 is formed on the polysilicon layer 402 without removing the polysilicon layer 402 after the gettering process for the heavy metal impurities is finished. This structure reduces the contact resistance between the collector electrode 406 and the polysilicon layer 402 to further reduce the ON-state voltage of the IGBT 400. Since this effect is the same as that of the IGBT 300 described in the third preferred embodiment, it is not fully described again.

<4-4. Examples of Modifications>

With the IGBT 400 described above, the polysilicon layer 402 is formed over the entire surface of the P+ collector layer 403. However, it is not always necessary to form the polysilicon layer 402 all over the surface.

Figure 38:
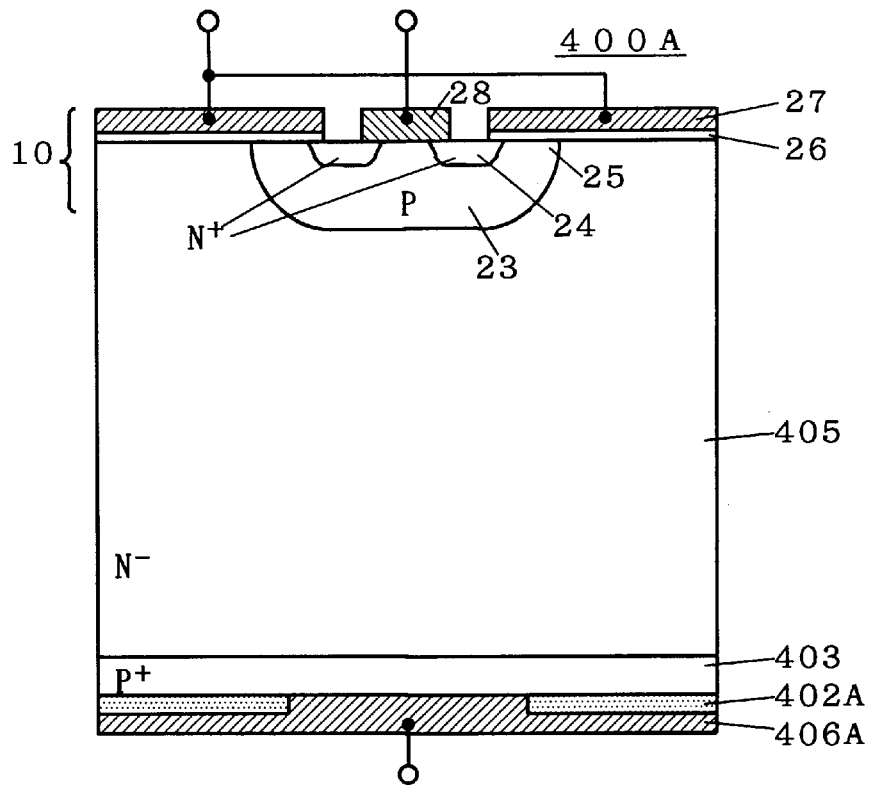
FIG. 38 is a cross-sectional view showing a structure of a modification of the semiconductor device of the fourth preferred embodiment of the present invention.

FIG. 38 shows an IGBT 400A in which a polysilicon layer 402A as a gettering layer is selectively formed on the external main surface of the P+ collector layer 403.

In FIG. 38, part of the external main surface of the P+ collector layer 403 is not covered with the polysilicon layer 402A, which part is in direct contact with the collector electrode 406A. This structure is in other respects the same as that of the IGBT 400 explained referring to FIG. 32 and the same structural elements are shown at the same reference characters and are not described again.

Figure 39:
FIG. 39 is a cross-sectional view showing the process of manufacturing the modification of the semiconductor device of the fourth preferred embodiment of the present invention.

In a method of manufacturing the IGBT 400A, first as shown in FIG. 39, with a silicon substrate 401 prepared, a polysilicon layer is formed all over its lower main surface (the side on which the collector electrode is formed later) by CVD, for example, which is patterned by photolithography technology to selectively form the polysilicon layer 402A. This process step is followed by the same process steps as those in the fabrication method for the IGBT 400 described referring to FIGS. 33 to 37 and are not described again here.

As for the plane configuration of the polysilicon layer 402A, it can be formed into stripes or into islands as described referring to FIG. 30 and FIG. 31. This is not described again here.

Selectively forming the polysilicon layer 402A in the form of stripes or islands provides the effect of reducing the bow of the substrate due to the presence of the polysilicon layer.

<Examples of Modifications of First to Fourth Preferred Embodiments>

In the above-described first to fourth preferred embodiments of the present invention, a single-crystal silicon substrate is used as a main material for the semiconductor base body. However, needless to say, an epitaxial substrate may be used in place of the single-crystal substrate.

The conductivity type is not limited to N type, but may be P type. In this case, the IGBT is of P channel type.

<Fifth Preferred Embodiment>

Figure 41:
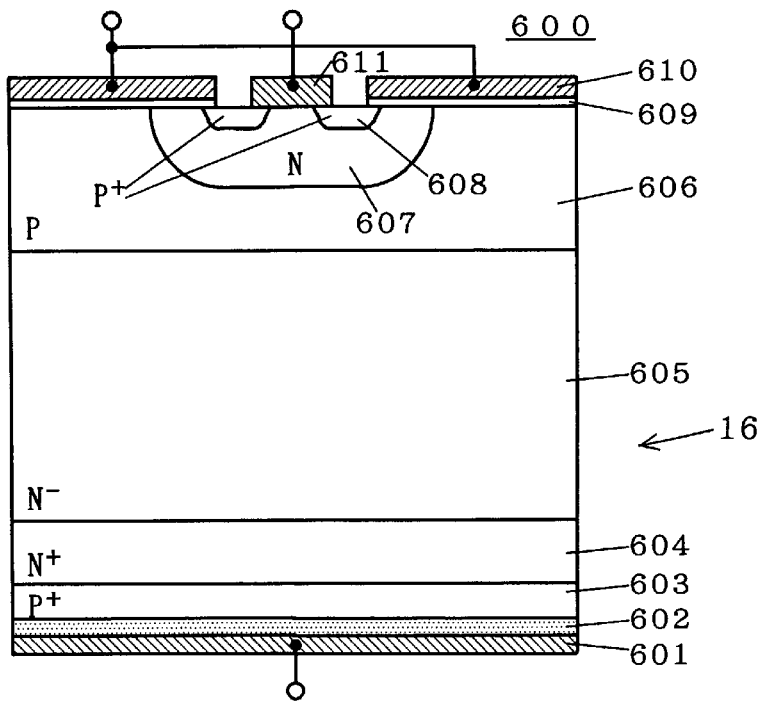
Figure 42:
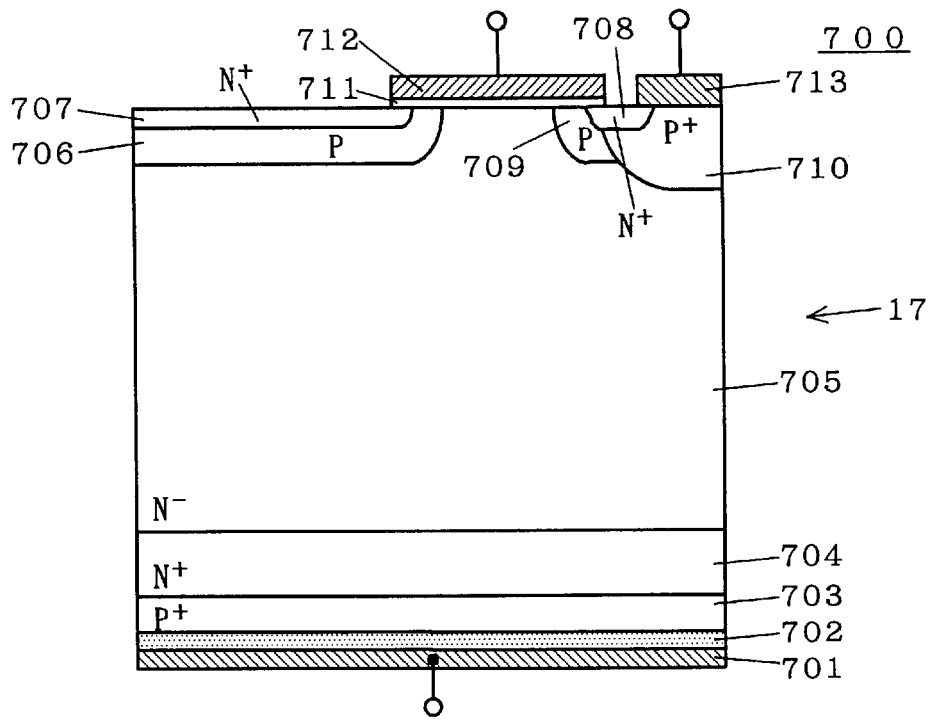
Figure 43:
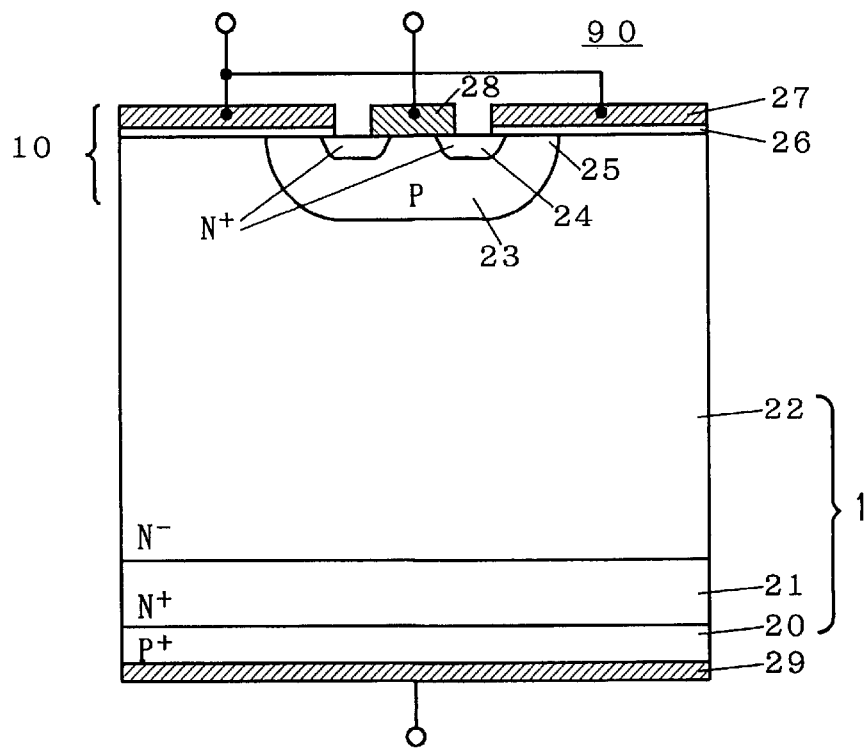
FIG. 43 is a cross-sectional view showing the structure of a conventional semiconductor device.

The above-described first to fourth preferred embodiments of the invention have shown applications to IGBTs as examples. However, the present invention can be applied not only to the IGBTs, but also to various vertical-type semiconductor devices, such as GTO (Gate Turn Off) thyristors, MCTs (Mos Control Thyristors), ESTs (Emitter Switched Thyristors) and so on. Structures of applications of the invention to a GTO thyristor, an MCT, and an EST are shown in FIG. 40, FIG. 41, and FIG. 42, respectively.

<5-1. GTO Thyristor>

Figure 40:
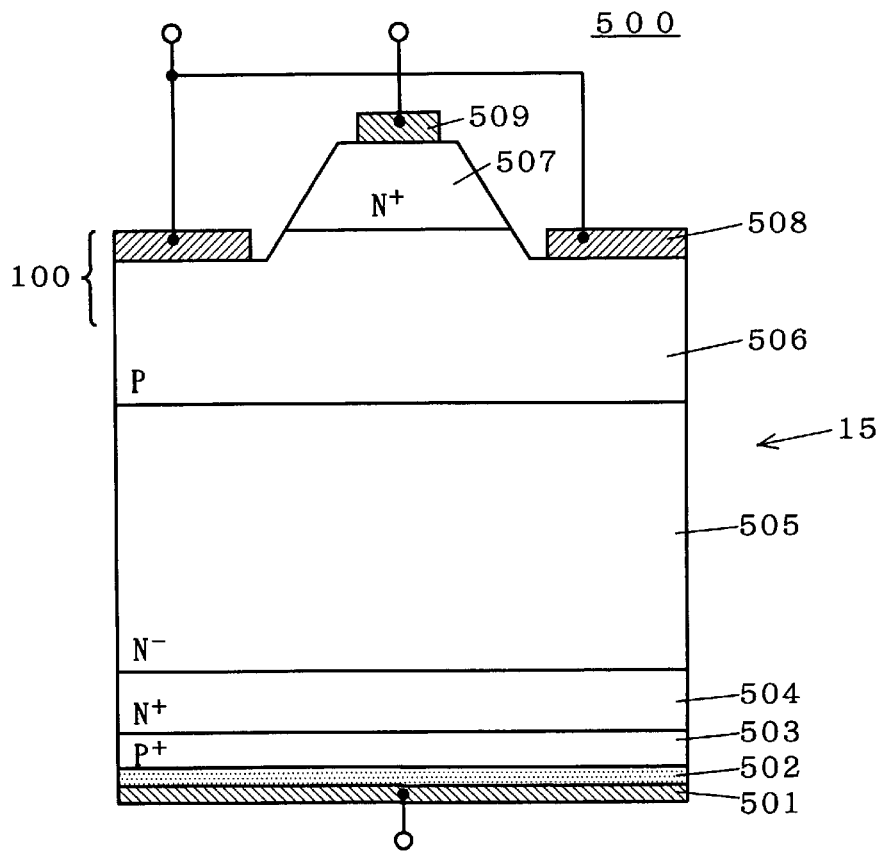
FIGS. 40 to 42 are cross-sectional views showing structures of semiconductor devices according to a fifth preferred embodiment of the present invention.

FIG. 40 is a cross-sectional view showing a structure of an application of the invention to a GTO thyristor 500. The GTO thyristor 500 has a semiconductor base body 15 formed of a gettering layer 502, a P+ layer 503 (the second semiconductor layer), an N+ buffer layer 504 (the third semiconductor layer), an N− layer 505 (the first semiconductor layer), a P layer 506, and an N+ layer 507 laid one on top of another, a gate electrode 508 selectively formed on the P layer 506, a cathode electrode 509 (the second main electrode) formed on the upper main surface of the N+ layer 507 selectively formed on the P layer 506, and an anode electrode 501 (the first main electrode) formed on the lower main surface of the semiconductor base body 15, specifically on the external main surface of the gettering layer 502.

The gettering layer 502 is formed of a damaged layer or a polysilicon layer as described in the first to fourth preferred embodiments, which can apply gettering to heavy metal impurities introduced in the process of manufacturing the GTO thyristor 500, e.g., in the process steps for forming the P+ layer 503, the N+ buffer layer 504, the P layer 506, and the N+ layer 507.

Further, the presence of the anode electrode 501 on the external main surface of the gettering layer 502 reduces the contact resistance between the anode electrode 501 and the gettering layer 502.

<5-2. MCT>

FIG. 41 is a cross-sectional view showing the structure of an application of the invention to an MCT 600. The MCT 600 has a semiconductor base body 16 formed of a gettering layer 602, a P+ layer 603 (the second semiconductor layer), an N+ buffer layer 604 (the third semiconductor layer), an N− layer 605 (the first semiconductor layer), and a P layer 606 laid one on top of another, a gate electrode 610 selectively formed on the upper main surface of the semiconductor base body 16, specifically on the external main surface of the P layer 606, with a gate insulating film 609 interposed therebetween, a cathode electrode 611 (the second main electrode) selectively formed on the upper main surface of the semiconductor base body 16, and an anode electrode 601 (the first main electrode) formed on the lower main surface of the semiconductor base body 16, specifically on the external main surface of the gettering layer 602.

An N base region 607 is selectively formed in the part extending from the surface of the P layer 606 to the inside thereof, and a pair of P emitter regions 608 are selectively formed to face each other at an interval in the part extending from the surface of the N base region 607 to the inside thereof. The cathode electrode 611 is formed on the opposing ends of the pair of P emitter regions 608 and on the part of the N base region 607 between the two. The gate electrode 610 is formed above the other ends of the pair of P emitter regions 608, the N base region 607 adjacent to those ends, and the P layer 606 adjacent to the N base region 607, with the gate insulating film 609 interposed therebetween.

The gettering layer 602 is formed of a damaged layer or a polysilicon layer as described in the first to fourth preferred embodiments, which can apply the gettering effect to heavy metal impurities introduced in the process of manufacturing the MCT 600, e.g., in the process steps for forming the P+ layer 603, the N+ buffer layer 604, the P layer 606, and the N layer 607.

Further, the presence of the anode electrode 601 on the external main surface of the gettering layer 602 reduces the contact resistance between the anode electrode 601 and the gettering layer 602.

<5-3. EST>

FIG. 42 is a cross-sectional view showing the structure of an application of the invention to an EST 700. The EST 700 has a semiconductor base body 17 formed of a gettering layer 702, a P$^+$ layer 703 (the second semiconductor layer), an N+buffer layer 704 (the third semiconductor layer), an N$^-$ layer 705 (the first semiconductor layer) laid one on top of another, a gate electrode 712 selectively formed on the upper main surface of the semiconductor base body 17, specifically on the external main surface of the N$^-$ layer 705, with a gate insulating film 711 interposed therebetween, a cathode electrode 713 (the second main electrode) selectively formed on the upper main surface of the semiconductor base body 17, and an anode electrode 701 (the first main electrode) formed on the lower main surface of the semiconductor base body 17, specifically on the external main surface of the gettering layer 702.

P regions 706 and 709 are selectively formed in the part extending from the surface of the N$^-$ layer 705 to the inside thereof, and an N$^+$ region 707 is selectively formed in the region extending from the surface of the P region 706 to the inside thereof. A P$^+$ region 710 is formed adjacent to the P region 709, and an N$^+$ region 708 is selectively formed in the region extending from the surface of the P region 709 and the P$^+$ region 710 to the inside of the two regions.

The cathode electrode 713 is formed on one end of the N$^+$ region 708 and on the P$^+$ region 710, and the gate electrode 712 is formed on the region extending from the other end of the N$^+$ region 708, the P region 709, the N$^-$ layer 705, the P region 706, to an end of the N$^+$ region 707, with the gate insulating film 711 interposed therebetween.

The gettering layer 702 is formed of a damaged layer or a polysilicon layer as described in the first to fourth preferred embodiments, which can provide the gettering effect of heavy metal impurities introduced in the process of manufacturing the EST 700, e.g., in the process steps for forming the P$^+$ layer 703, the N$^+$ buffer layer 704, the P regions 706 and 709, the N$^+$ region 707, the N+region 708, and the P$^+$ region 710.

Further, the presence of the anode electrode 701 on the external main surface of the gettering layer 702 reduces the contact resistance between the anode electrode 701 and the gettering layer 702.

The gettering layers 502, 602, 702 correspond to the damaged layers or the polysilicon layers explained in the first to fourth preferred embodiments.

While the invention has been described in detail, the foregoing description is in all aspects illustrative and not restrictive. It is understood that numerous other modifications and variations can be devised without departing from the scope of the invention.

We claim:

1. A semiconductor device comprising:
   a first semiconductor layer of a first conductivity type;
   a second semiconductor layer of a second conductivity type at a relatively high concentration, compared to said first semiconductor layer, provided to form an interface with a first main surface of said first semiconductor layer;
   a gettering layer provided on an upper part of a first main surface of said second semiconductor layer on the opposite side to the interface with said first semiconductor layer to form an interface with said first main surface of said second semiconductor layer, for segregating metal impurities;
   a first main electrode provided to be in direct contact with at least a first main surface of said gettering layer on the opposite side to the interface with said second semiconductor layer; and
   a second main electrode provided on a second main surface of said first semiconductor layer on the opposite side to said first main surface of said first semiconductor layer.

2. The semiconductor device according to claim 1, wherein said gettering layer is a damaged layer having crystal defects caused by mechanical damage.

3. The semiconductor device according to claim 1, wherein said gettering layer is a polysilicon layer having crystal defects.

4. A semiconductor device comprising:
   a first semiconductor layer of a first conductivity type;
   a second semiconductor layer of a second conductivity type at a relatively high concentration provided to form an interface with a first main surface of said first semiconductor layer;
   a gettering layer provided to form an interface with a first main surface of said second semiconductor layer on the opposite side to the interface with said first semiconductor layer, for segregating metal impurities;
   a first main electrode provided to he in contact with at least a first main surface of said gettering layer on the opposite side to the interface with said second semiconductor layer; and
   a second main electrode provided on a second main surface of said first semiconductor layer on the opposite side to said first main surface of said first semiconductor layer;
   wherein said gettering layer is a polysilicon layer having crystal defects, and
   wherein said polysilicon layer is selectively formed on said first main surface of said second semiconductor layer, and
   said first main electrode is formed to be in contact also with said second semiconductor layer.

5. The semiconductor device according to claim 4, wherein said gettering layer is shaped in the form of a plurality of stripes arranged at intervals in a plane view.

6. The semiconductor device according to claim 4, wherein said gettering layer is shaped in the form of a plurality of island-like regions arranged at intervals in a plane view.

7. The semiconductor device according to claim 1, wherein said first semiconductor layer has, in its inside, a third semiconductor layer of the first conductivity type at a relatively high concentration provided to form an interface with said second semiconductor layer.

8. The semiconductor device according to claim 7, wherein said gettering layer is a damaged layer having crystal defects caused by mechanical damage.

9. The semiconductor device according to claim 7, wherein said gettering layer is a polysilicon layer having crystal defects.

10. A semiconductor device comprising:
    a first semiconductor layer of a first conductivity type;
    a second semiconductor layer of a second conductivity type at a relatively high concentration provided to form an interface with a first main surface of said first semiconductor layer;

a gettering layer provided to form an interface with a first main surface of said second semiconductor layer on the opposite side to the interface with said first semiconductor layer, for segregating metal impurities;

a first main electrode provided to be in contact with at least a first main surface of said gettering layer on the opposite side to the interface with said second semiconductor layer; and a second main electrode provided on a second main surface of said first semiconductor layer on the opposite side to said first main surface of said first semiconductor layer;

wherein said first semiconductor layer has, in its inside, a third semiconductor layer of the first conductivity type at a relatively high concentration provided to form an interface with said semiconductor layer;

wherein said gettering layer is a polysilicon layer having crystal defects, and wherein said polysilicon layer is selectively formed on said first main surface of said second semiconductor layer, and said first main electrode is formed to be in contact also with said second semiconductor layer.

11. The semiconductor device according to claim 10, wherein said gettering layer is shaped in the form of a plurality of stripes arranged at intervals in a plane view.

12. The semiconductor device according to claim 10, wherein said gettering layer is shaped in the form of a plurality of island-like regions arranged at intervals in a plane view.

13. A semiconductor device comprising, a semiconductor base body formed on the basis of a semiconductor substrate of a first conductivity type and having a plurality of semiconductor layers, a first main electrode formed on a first main surface of said semiconductor base body, and a second main electrode provided on a second main surface of said semiconductor base body on the opposite side to said first main surface, wherein a main current flows between said first and second main electrodes, wherein said first main surface of said semiconductor base body is a main surface of a gettering layer for segregating metal impurities, said semiconductor base body has a first semiconductor layer of a second conductivity type at a relatively high concentration, compared to said first semiconductor layer, provided to form an interface with said gettering layer, and said first main electrode is formed directly on at least said gettering layer.

14. The semiconductor device according to claim 13, wherein said semiconductor base body comprises a second semiconductor layer of the first conductivity type at a relatively high concentration provided to form an interface with a main surface of said first semiconductor layer on the opposite side to the interface with said gettering layer.

* * * * *